(12) United States Patent
Tomizawa et al.

(10) Patent No.: US 9,172,016 B2
(45) Date of Patent: Oct. 27, 2015

(54) SEMICONDUCTOR LIGHT EMITTING DEVICE AND METHOD FOR MANUFACTURING SAME

(71) Applicant: Kabushiki Kaisha Toshiba, Minato-ku (JP)

(72) Inventors: Hideyuki Tomizawa, Gunma-ken (JP); Akihiro Kojima, Ishikawa-ken (JP); Miyoko Shimada, Kanagawa-ken (JP); Yosuke Akimoto, Tokyo (JP); Miyuki Shimojuku, Kanagawa-ken (JP); Hideto Furuyama, Kanagawa-ken (JP); Yoshiaki Sugizaki, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/153,160

(22) Filed: Jan. 13, 2014

(65) Prior Publication Data

US 2015/0034985 A1    Feb. 5, 2015

(30) Foreign Application Priority Data

Jul. 31, 2013  (JP) .................................. 2013-159346

(51) Int. Cl.
| | |
|---|---|
| *H01L 33/60* | (2010.01) |
| *H01L 33/50* | (2010.01) |
| *H01L 33/48* | (2010.01) |
| *H01L 33/44* | (2010.01) |
| *H01L 33/46* | (2010.01) |

(52) U.S. Cl.
CPC .............. *H01L 33/60* (2013.01); *H01L 33/486* (2013.01); *H01L 33/50* (2013.01); *H01L 33/44* (2013.01); *H01L 33/46* (2013.01); *H01L 2933/0033* (2013.01)

(58) Field of Classification Search
None
See application file for complete search history.

(56) References Cited

U.S. PATENT DOCUMENTS 7,767,485 B2 *   8/2010   Ogawa et al. ................... 438/65
8,110,421 B2     2/2012   Sugizaki et al.
(Continued)

FOREIGN PATENT DOCUMENTS

EP    2 302 708 A2    3/2011
EP    2 393 133 A1    12/2011
(Continued)

OTHER PUBLICATIONS

Extended European Search Report issued on Dec. 10, 2014 in Patent Application No. 14150911.7.
(Continued)

*Primary Examiner* — Jerome Jackson, Jr.
*Assistant Examiner* — Steven B Gauthier
(74) *Attorney, Agent, or Firm* — Oblon, McClelland, Maier & Neustadt, L.L.P.

(57) ABSTRACT

According to one embodiment, the optical layer has a larger planar size than the semiconductor layer. The optical layer is transmissive to emission light of the light emitting layer. The first insulating film is provided on a side surface of the semiconductor layer continued from the first surface. The metal film includes a first reflective part covering the side surface of the semiconductor layer via the first insulating film. The metal film includes a second reflective part opposed to the optical layer in a region around the side surface of the semiconductor layer and extending from the first reflective part toward a side opposite from the side surface of the semiconductor layer.

19 Claims, 15 Drawing Sheets

(56) References Cited

U.S. PATENT DOCUMENTS

| | | | |
|---|---|---|---|
| 8,350,285 B2 | 1/2013 | Sugizaki et al. | |
| 2010/0148198 A1 | 6/2010 | Sugizaki et al. | |
| 2011/0018026 A1* | 1/2011 | Konno et al. | 257/100 |
| 2011/0073889 A1* | 3/2011 | Sugizaki et al. | 257/98 |
| 2011/0248406 A1* | 10/2011 | Wada et al. | 257/773 |
| 2011/0297969 A1* | 12/2011 | Kojima et al. | 257/88 |
| 2011/0298001 A1* | 12/2011 | Akimoto et al. | 257/99 |
| 2012/0097972 A1 | 4/2012 | Sugizaki et al. | |
| 2013/0015483 A1 | 1/2013 | Shimokawa et al. | |
| 2013/0092970 A1 | 4/2013 | Sugizaki et al. | |

FOREIGN PATENT DOCUMENTS

| | | |
|---|---|---|
| EP | 2 546 894 A2 | 1/2013 |
| JP | 2010-141176 A | 6/2010 |
| JP | 2011-71272 | 4/2011 |
| JP | 2013-21175 | 1/2013 |
| JP | 2013-065773 A | 4/2013 |
| JP | 2013-106048 A | 5/2013 |
| KR | 10-2013-0008478 A | 1/2013 |
| TW | 2011-28807 | 8/2011 |
| TW | 2012-30407 | 7/2012 |

OTHER PUBLICATIONS

Office Action issued Nov. 25, 2014 in Korean Patent Application No. 10-2013-0147606 (with English language translation).

Office Action issued Jul. 30, 2015 in Korean Patent Application No. 10-2013-0147606 (with English Translation).

Office Action issued Jul. 29, 2015, in Taiwanese Patent Application No. 102143224, with English-language Translation.

* cited by examiner

US 9,172,016 B2

SEMICONDUCTOR LIGHT EMITTING DEVICE AND METHOD FOR MANUFACTURING SAME

CROSS-REFERENCE TO RELATED APPLICATION

This application is based upon and claims the benefit of priority from Japanese Patent Application No. 2013-159346, filed on Jul. 31, 2013; the entire contents of which are incorporated herein by reference.

FIELD

Embodiments described herein relate generally to a semiconductor light emitting device and a method for manufacturing a semiconductor light emitting device.

BACKGROUND

A semiconductor light emitting device for emitting visible light such as white light or light in other wavelength bands can be based on a combination of an LED (light emitting diode) element and phosphor. As such a semiconductor light emitting device, a semiconductor light emitting device having a chip size package structure has been proposed. In such a semiconductor light emitting device, there is demand for increasing the light extraction efficiency.

DETAILED DESCRIPTION

Figure 1A:
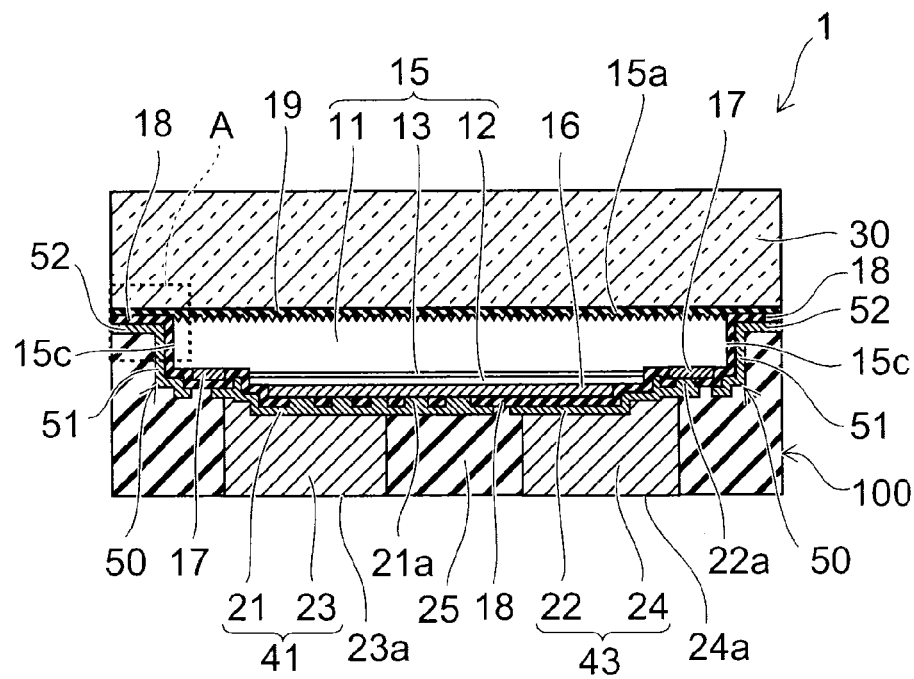
FIGS. 1A and 1B are schematic sectional views of a semiconductor light emitting device of an embodiment.

According to one embodiment, a semiconductor light emitting device includes a semiconductor layer, a p-side electrode, an n-side electrode, a support body, an optical layer, a first insulating film, and a metal film. The semiconductor layer has a first surface and a second surface on opposite side from the first surface, and includes a light emitting layer. The p-side electrode is provided on the semiconductor layer on the second surface side. The n-side electrode is provided on the semiconductor layer on the second surface side. The support body is provided on the second surface side. The support body includes a p-side interconnection part connected to the p-side electrode, an n-side interconnection part connected to the n-side electrode, and a resin layer provided between the p-side interconnection part and the n-side interconnection part. The optical layer is provided on the first surface side. The optical layer has a larger planar size than the semiconductor layer. The optical layer is transmissive to emission light of the light emitting layer. The first insulating film is provided on a side surface of the semiconductor layer continued from the first surface. The metal film includes a first reflective part covering the side surface of the semiconductor layer via the first insulating film. The metal film includes a second reflective part opposed to the optical layer in a region around the side surface of the semiconductor layer and extending from the first reflective part toward a side opposite from the side surface of the semiconductor layer.

Embodiments will now be described with reference to the drawings. In the drawings, like elements are labeled with like reference numerals.

(First Embodiment)

FIG. 1A is a schematic sectional view of a semiconductor light emitting device 1 of a first embodiment.

Figure 1B:
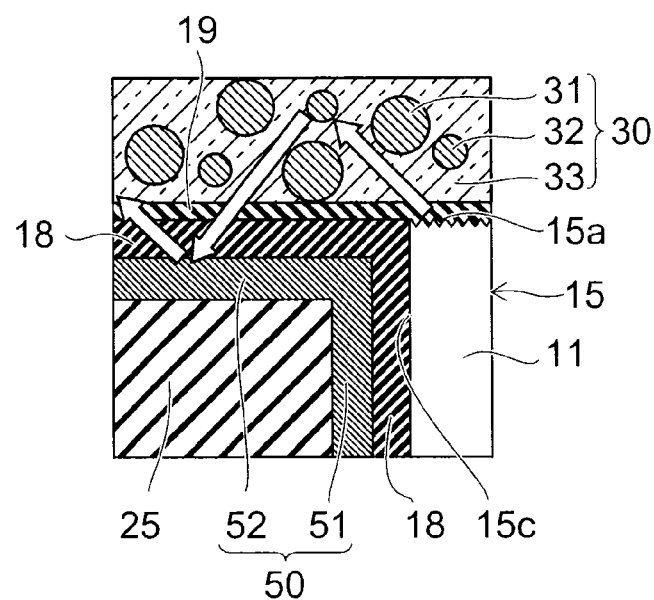

FIG. 1B is a schematic enlarged view of the portion enclosed with dashed line A in FIG. 1A.

The semiconductor light emitting device 1 includes a semiconductor layer 15 including a light emitting layer 13. The semiconductor layer 15 has a first surface 15a and a second surface 15b (see FIG. 6A) on the opposite side therefrom.

Figure 2A:
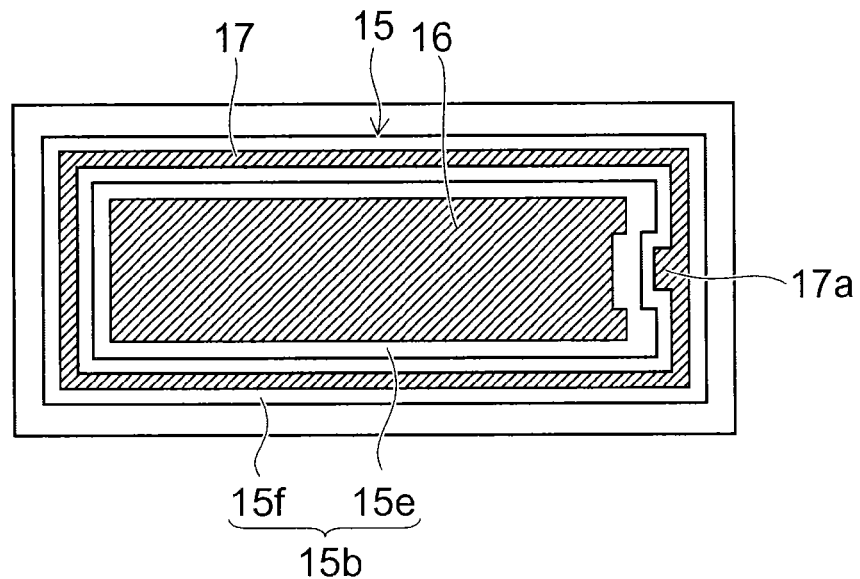
FIGS. 2A and 2B are schematic plan views of a second surface side of the semiconductor light emitting device of the embodiment.

FIG. 2A is a schematic plan view of the second surface 15b side of the semiconductor layer 15.

The second surface 15b of the semiconductor layer 15 includes a portion (light emitting region) 15e including the light emitting layer 13 and a portion (non-light emitting region) 15f not including the light emitting layer 13. The portion 15e including the light emitting layer 13 is a portion of the semiconductor layer 15 in which the light emitting layer 13 is stacked. The portion 15f not including the light emitting layer 13 is a portion of the semiconductor layer 15 in which the light emitting layer 13 is not stacked. The portion 15e including the light emitting layer 13 represents a light emitting region. In addition to including the light emitting layer 13, the portion 15e represents a region having a stacked structure in which the emission light of the light emitting layer 13 can be extracted to the outside.

On the second surface 15b side, a p-side electrode 16 is provided on the portion 15e including the light emitting layer 13, and an n-side electrode 17 is provided on the portion 15f not including the light emitting layer. For instance, in plan view shown in FIG. 2A, the portion 15f not including the light emitting layer 13 surrounds the portion 15e including the light emitting layer 13, and the n-side electrode 17 surrounds the p-side electrode 16. The planar layout of the p-side electrode 16 and the n-side electrode 17 is not limited to the example shown in FIG. 2A.

A current is supplied to the light emitting layer 13 through the p-side electrode 16 and the n-side electrode 17. Thus, the light emitting layer 13 emits light. The light emitted from the light emitting layer 13 is emitted out from the first surface 15a side to the outside of the semiconductor light emitting device 1.

On the second surface side of the semiconductor layer 15, as shown in FIG. 1A, a support body 100 is provided. The light emitting element including the semiconductor layer 15, the p-side electrode 16, and the n-side electrode 17 is supported by the support body 100 provided on the second surface side.

On the first surface 15a of the semiconductor layer 15, a phosphor layer 30 is provided as an optical layer for imparting desired optical characteristics to the emission light of the semiconductor light emitting device 1. As shown in FIG. 1B, the phosphor layer 30 includes a plurality of phosphors 31, 32. The phosphors 31, 32 are excited by the emission light of the light emitting layer 13 and emit light of a wavelength different from that of the emission light.

The plurality of phosphors 31, 32 are integrated by a binder 33. The binder 33 transmits the emission light of the light emitting layer 13 and the emission light of the phosphors 31, 32. The term "transmit" used herein is not limited to a transmittance of 100%, but includes the case of absorbing part of the light.

The semiconductor layer 15 includes a first semiconductor layer 11, a second semiconductor layer 12, and a light emitting layer 13. The light emitting layer 13 is provided between the first semiconductor layer 11 and the second semiconductor layer 12. The first semiconductor layer 11 and the second semiconductor layer 12 include e.g. gallium nitride.

The first semiconductor layer 11 includes e.g. a foundation buffer layer and an n-type GaN layer. The second semiconductor layer 12 includes e.g. a p-type GaN layer. The light emitting layer 13 includes a material emitting e.g. blue, violet, blue-violet, or ultraviolet light. The emission peak wavelength of the light emitting layer 13 is e.g. 430-470 nm.

The second surface 15b of the semiconductor layer 15 is processed into an uneven shape including a projection and a depression. The projection is the portion 15e including the light emitting layer 13. The depression is the portion 15f not including the light emitting layer 13. The surface of the portion 15e including the light emitting layer 13 is a surface of the second semiconductor layer 12. The p-side electrode 16 is provided on the surface of the second semiconductor layer 12. The surface of the portion 15f not including the light emitting layer 13 is a surface of the first semiconductor layer 11. The n-side electrode 17 is provided on the surface of the first semiconductor layer 11.

For instance, on the second surface 15b of the semiconductor layer 15, the area of the portion 15e including the light emitting layer 13 is larger than the area of the portion 15f not including the light emitting layer 13. Furthermore, the area of the p-side electrode 16 provided on the surface of the portion 15e including the light emitting layer 13 is larger than the area of the n-side electrode 17 provided on the surface of the portion not including the light emitting layer 13. Thus, a large light emitting surface is obtained. Accordingly, the optical output can be increased.

On the second surface 15b side of the semiconductor layer 15, an insulating film 18 is provided. The insulating film covers and protects the second surface 15b of the semiconductor layer 15, the p-side electrode 16, and the n-side electrode 17. The insulating film 18 is an inorganic insulating film such as silicon oxide film.

The insulating film 18 is provided also on the side surface of the light emitting layer 13 and the side surface of the second semiconductor layer 12. The insulating film 18 covers and protects these side surfaces.

Furthermore, the insulating film 18 is provided also on the side surface 15c (the side surface of the first semiconductor layer 11) of the semiconductor layer 15 continued from the first surface 15a. The insulating film 18 covers and protects the side surface 15c.

Moreover, the insulating film 18 is provided also in the region around the side surface 15c of the semiconductor layer 15. On the first surface 15a side, the insulating film 18 provided in the region around the side surface 15c extends from the side surface 15c toward the side (the side surface of the semiconductor light emitting device 1) opposite from the side surface 15c.

On the surface of the insulating film 18 on the opposite side from the semiconductor layer 15, a p-side interconnection layer 21 and an n-side interconnection layer 22 are provided and spaced from each other.

Figure 8A:
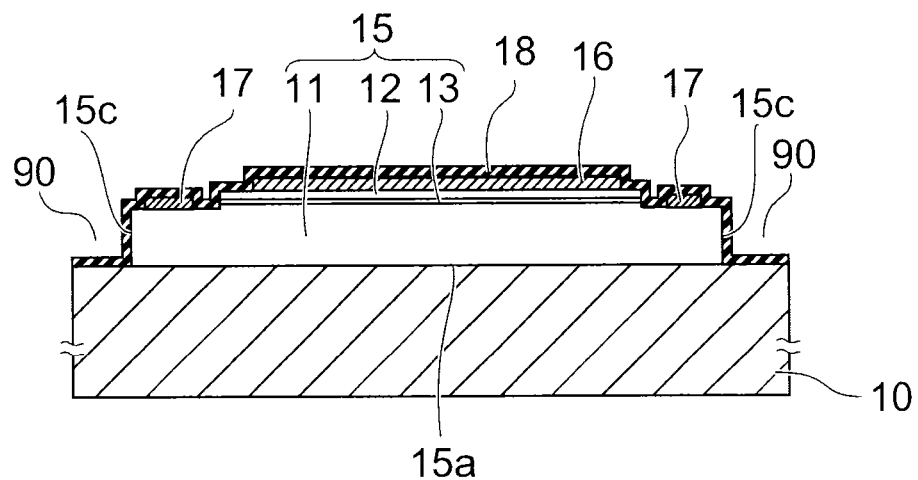
Figure 8B:
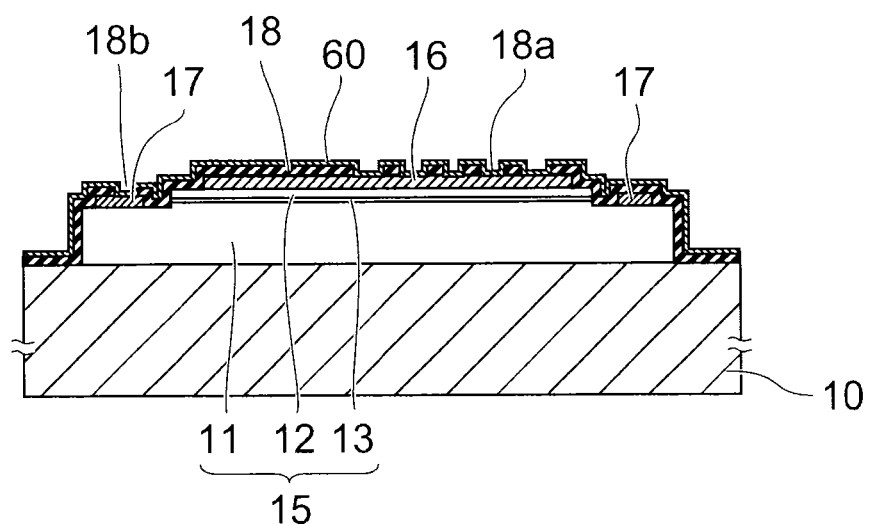

In the insulating film 18, as shown in FIG. 8B, a plurality of first openings 18a penetrating to the p-side electrode 16 and a second opening 18b penetrating to the n-side electrode 17 are formed. Here, the number of first openings 18a may be one.

The p-side interconnection layer 21 is provided on the insulating film 18 and inside the first openings 18a. The p-side interconnection layer 21 is electrically connected to the p-side electrode 16 through a via 21a provided in the first opening 18a. The n-side interconnection layer 22 is provided on the insulating film 18 and inside the second opening 18b. The n-side interconnection layer 22 is electrically connected to the n-side electrode 17 through a via 22a provided in the second opening 18b.

Figure 2B:
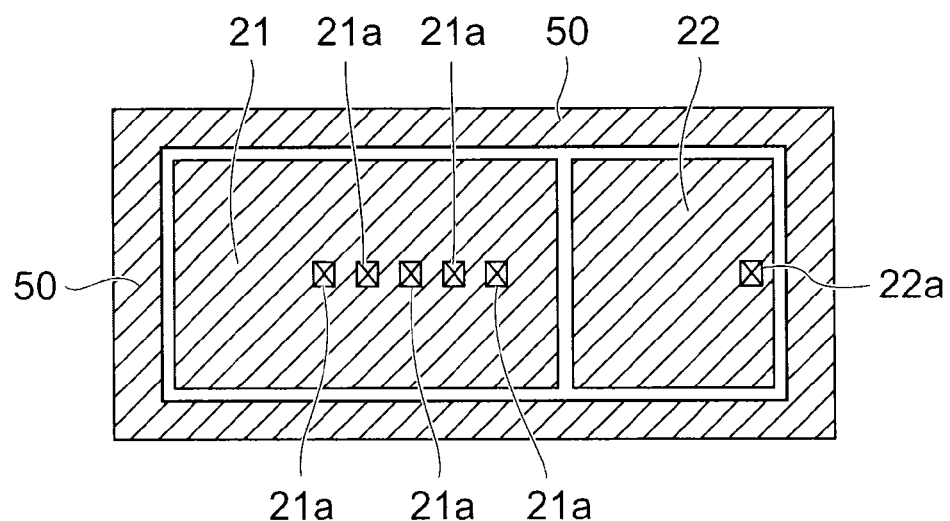

FIG. 2B shows an example of the planar layout of the p-side interconnection layer 21 and the n-side interconnection layer 22.

The p-side interconnection layer 21 and the n-side interconnection layer 22 spread on the insulating film 18, occupying most of the region on the second surface 15b side. The p-side interconnection layer 21 is connected to the p-side electrode 16 through a plurality of vias 21a.

As shown in FIG. 2A, the n-side electrode 17 is formed as a narrow wire electrode. On a portion of the narrow wire electrode, a pad part 17a with an expanded width is formed. The n-side interconnection layer 22 is connected to the n-side electrode 17 through the via 22a reaching the pad part 17a.

As shown in FIGS. 1A and 1B, a metal film 50 is provided on the insulating film 18 in the region around the side surface 15c of the semiconductor layer 15. The metal film 50 is reflective to the emission light of the light emitting layer 13 and the emission light of the phosphors 31, 32.

As shown in FIG. 2B, the metal film 50 is separated from the p-side interconnection layer 21 and the n-side interconnection layer 22. The metal film 50 is provided continuously to the region around the side surface 15c of the semiconductor layer 15.

The metal film 50 is provided in an L-shaped cross section along the insulating film 18 covering the side surface 15c of the semiconductor layer 15 and the insulating film 18 extending from the side surface 15c to the side opposite from the side surface 15c.

The metal film 50 includes a first reflective part 51 covering the side surface 15c of the semiconductor layer 15 via the insulating film 18. The first reflective part 51 is not in contact with the side surface 15c. The first reflective part 51 is not electrically connected to the semiconductor layer 15.

Furthermore, the metal film 50 includes a second reflective part 52 extending from the first reflective part 51 toward the side (the side surface of the semiconductor light emitting device 1) opposite from the side surface 15c. The second reflective part 52 is opposed to the phosphor layer 30 via the insulating film 18 and an insulating film 19 described later in the region around the side surface 15c of the semiconductor layer 15. That is, the second reflective part 52 is provided below the phosphor layer 30 in the region around the side surface 15c of the semiconductor layer 15.

The metal film 50, the p-side interconnection layer 21, and the n-side interconnection layer 22 include e.g. a copper film formed simultaneously by plating technique on a common foundation metal film.

Figure 5:
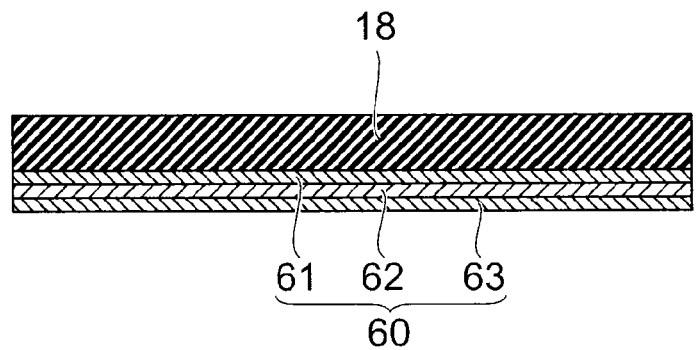
FIG. 5 is a schematic sectional view of a metal film of the semiconductor light emitting device of the embodiment.

FIG. 5 is a schematic sectional view of the foundation metal film 60.

The copper film, for instance, constituting the metal film 50, the p-side interconnection layer 21, and the n-side interconnection layer 22 is formed by plating technique on the foundation metal film 60 formed on the insulating film 18. Alternatively, the foundation metal film 60 also constitutes the metal film 50, the p-side interconnection layer 21, and the n-side interconnection layer 22.

The foundation metal film 60 includes an aluminum (Al) film 61, a titanium (Ti) film 62, and a copper (Cu) film 63 stacked sequentially from the insulating film 18 side.

The aluminum film 61 functions as a reflective film. The copper film 63 functions as a seed layer for plating. The titanium film 62 is superior in wettability for both aluminum and copper, and functions as an adhesive layer.

For instance, the thickness of the foundation metal film 60 is approximately 1 μm. The thickness of each of the metal film 50, the p-side interconnection layer 21, and the n-side interconnection layer 22 is several μm.

In the region around the side surface 15c of the semiconductor layer 15, the metal film 50 may be a film made of the foundation metal film 60 without formation of a plating film (copper film) on the foundation metal film 60. By including at least the aluminum film 61, the metal film 50 has high reflectance to the emission light of the light emitting layer 13 and the emission light of the phosphors 31, 32.

Furthermore, the aluminum film 61 is left also below the p-side interconnection layer 21 and the n-side interconnection layer 22. Thus, the aluminum film (reflective film) 61 is formed over most of the region on the second surface 15b side. This can increase the amount of light directed to the phosphor layer 30 side.

On the surface of the p-side interconnection layer 21 on the opposite side from the semiconductor layer 15, a p-side metal pillar 23 is provided. The p-side interconnection layer 21 and the p-side metal pillar 23 form a p-side interconnection part 41.

On the surface of the n-side interconnection layer 22 on the opposite side from the semiconductor layer 15, an n-side metal pillar 24 is provided. The n-side interconnection layer 22 and the n-side metal pillar 24 form an n-side interconnection part 43.

A resin layer 25 is provided as an insulating film between the p-side interconnection part 41 and the n-side interconnection part 43. The resin layer 25 is provided between the p-side metal pillar 23 and the n-side metal pillar 24 so as to be in contact with the side surface of the p-side metal pillar 23 and the side surface of the n-side metal pillar 24. That is, the resin layer 25 is filled between the p-side metal pillar 23 and the n-side metal pillar 24.

Furthermore, the resin layer 25 is provided between the p-side interconnection layer 21 and the n-side interconnection layer 22, between the p-side interconnection layer 21 and the metal film 50, and between the n-side interconnection layer 22 and the metal film 50.

The resin layer 25 is provided around the p-side metal pillar 23 and around the n-side metal pillar 24. The resin layer 25 covers the side surface of the p-side metal pillar 23 and the side surface of the n-side metal pillar 24.

The resin layer 25 is provided also in the region around the side surface 15c of the semiconductor layer 15. The resin layer 25 covers the metal film 50.

The end part (surface) of the p-side metal pillar 23 on the opposite side from the p-side interconnection layer 21 is exposed from the resin layer 25 and functions as a p-side external terminal 23a connectable to an external circuit of e.g. a mounting substrate. The end part (surface) of the n-side metal pillar 24 on the opposite side from the n-side interconnection layer 22 is exposed from the resin layer 25 and functions as an n-side external terminal 24a connectable to an external circuit of e.g. the mounting substrate. The p-side external terminal 23a and the n-side external terminal 24a are bonded to a land pattern of the mounting substrate via e.g. solder or a conductive bonding material.

The p-side external terminal 23a and the n-side external terminal 24a are spaced from each other and juxtaposed in the same surface (the lower surface in FIG. 1A) of the resin layer 25. The spacing between the p-side external terminal 23a and the n-side external terminal 24a is wider than the spacing between the p-side interconnection layer 21 and the n-side interconnection layer 22 on the insulating film 18. The spacing between the p-side external terminal 23a and the n-side external terminal 24a is made larger than the spread of solder at the mounting time. This can prevent short circuit between the p-side external terminal 23a and the n-side external terminal 24a via solder.

In contrast, the spacing between the p-side interconnection layer 21 and the n-side interconnection layer 22 can be narrowed to the process limit. This enables expansion of the area of the p-side interconnection layer 21 and the contact area between the p-side interconnection layer 21 and the p-side metal pillar 23. Thus, heat dissipation of the light emitting layer 13 can be facilitated.

The area in which the p-side interconnection layer 21 is in contact with the p-side electrode 16 through a plurality of vias 21a is larger than the area in which the n-side interconnection layer 22 is in contact with the n-side electrode 17 through the via 22a. Thus, the distribution of the current flowing in the light emitting layer 13 can be made uniform.

The area of the n-side interconnection layer 22 spread on the insulating film 18 can be made larger than the area of the n-side electrode 17. Furthermore, the area of the n-side metal pillar 24 provided on the n-side interconnection layer 22 (the area of the n-side external terminal 24a) can be made larger than the area of the n-side electrode 17. This can reduce the area of the n-side electrode 17 while ensuring the area of the n-side external terminal 24a sufficient for reliable mounting. That is, in the semiconductor layer 15, the area of the portion (non-light emitting region) 15f not including the light emitting layer 13 can be reduced, and the area of the portion (light emitting region) 15e including the light emitting layer 13 can be expanded. Thus, the optical output can be increased.

The first semiconductor layer 11 is electrically connected to the n-side metal pillar 24 via the n-side electrode 17 and the n-side interconnection layer 22. The second semiconductor layer 12 is electrically connected to the p-side metal pillar 23 via the p-side electrode 16 and the p-side interconnection layer 21.

The thickness of the p-side metal pillar 23 (the thickness in the direction connecting the p-side interconnection layer 21 and the p-side external terminal 23a) is thicker than the thickness of the p-side interconnection layer 21. The thickness of the n-side metal pillar 24 (the thickness in the direction connecting the n-side interconnection layer 22 and the n-side external terminal 24a) is thicker than the thickness of the n-side interconnection layer 22. The thickness of each of the p-side metal pillar 23, the n-side metal pillar 24, and the resin layer 25 is thicker than the thickness of the semiconductor layer 15.

The aspect ratio of the metal pillar 23, 24 (the ratio of thickness to planar size) may be 1 or more, or may be less than 1. That is, the metal pillar 23, 24 may be thicker or thinner than its planar size.

The thickness of the support body 100 including the p-side interconnection layer 21, the n-side interconnection layer 22, the p-side metal pillar 23, the n-side metal pillar 24, and the resin layer 25 is thicker than the thickness of the light emitting element including the semiconductor layer 15, the p-side electrode 16, and the n-side electrode 17.

As described later, the semiconductor layer 15 is formed by epitaxial growth technique on a substrate. The substrate is removed after forming the support body 100. Thus, the semiconductor layer 15 does not include the substrate on the first surface 15a side. The semiconductor layer 15 is supported not by a rigid substrate, but by the support body 100 including the resin layer 25.

The material of the p-side interconnection part 41 and the n-side interconnection part 43 can be e.g. copper, gold, nickel, or silver. Among them, use of copper can achieve good thermal conductivity, high migration resistance, and high adhesiveness to insulating material.

The resin layer 25 reinforces the p-side metal pillar 23 and the n-side metal pillar 24. It is desirable to use a resin layer 25 having a thermal expansion coefficient equal or close to that of the mounting substrate. Such a resin layer 25 can be made of e.g. a resin primarily including epoxy resin, a resin primarily including silicone resin, or a resin primarily including fluororesin.

Furthermore, the base resin of the resin layer 25 includes a light blocking material. Thus, the resin layer 25 is a black resin layer having a light blocking property for the emission light of the light emitting layer 13. This can suppress light leakage from the side surface and the mounting surface side of the support body 100.

By the thermal cycle at the mounting time of the semiconductor light emitting device 1, the semiconductor layer 15 is subjected to a stress due to e.g. solder for bonding the p-side external terminal 23a and the n-side external terminal 24a to the land of the mounting substrate. The p-side metal pillar 23, the n-side metal pillar 24, and the resin layer 25 absorb and relax the stress. In particular, the resin layer 25 softer than the semiconductor layer 15 is used as part of the support body 100. This can enhance the stress relaxation effect.

The metal film 50 is separated from the p-side interconnection part 41 and the n-side interconnection part 43. Thus, the stress applied to the p-side metal pillar 23 and the n-side metal pillar 24 at the mounting time is not transmitted to the metal film 50. This can suppress peeling of the metal film 50. Furthermore, this can suppress the stress applied to the side surface 15c side of the semiconductor layer 15.

As described later, the substrate used to form the semiconductor layer 15 is removed from the semiconductor layer 15. This reduces the profile of the semiconductor light emitting device 1. Furthermore, the removal of the substrate enables formation of unevenness at the first surface 15a of the semiconductor layer 15. This can improve the light extraction efficiency.

For instance, on the first surface 15a, wet etching with an alkaline solution (frost treatment) is performed to form a fine unevenness. This enables extraction of the emission light of the light emitting layer 13 from the first surface 15a to the outside without total reflection.

After the substrate is removed, a phosphor layer 30 is formed on the first surface 15a via an insulating film 19. The insulating film 19 functions as an adhesive layer for enhancing adhesiveness between the semiconductor layer 15 and the phosphor layer 30. The insulating film 19 is e.g. a silicon oxide film or silicon nitride film.

The phosphor layer 30 has a structure in which a plurality of particulate phosphors 31, 32 are dispersed in a binder 33. The phosphor 31 is e.g. a green phosphor emitting green light upon excitation by the emission light of the light emitting layer 13. The phosphor 32 is e.g. a red phosphor emitting red light upon excitation by the emission light of the light emitting layer 13. The binder 33 can be made of e.g. silicone resin.

The phosphor layer 30 is not limited to the configuration including two kinds of phosphors 31, 32. The phosphor layer 30 may have a configuration including one kind of phosphor (e.g. yellow phosphor emitting yellow light upon excitation by the emission light of the light emitting layer 13).

The phosphor layer 30 is formed also on the region around the side surface 15c of the semiconductor layer 15. Thus, the planar size of the phosphor layer 30 is larger than the planar size of the semiconductor layer 15.

In the region around the side surface 15c of the semiconductor layer 15, the phosphor layer 30 is provided on the metal film 50 via the insulating films 18, 19. Below the metal film 50, the resin layer 25 is provided.

The phosphor layer 30 is restricted on the first surface 15a of the semiconductor layer 15, and on the region around the side surface 15c of the semiconductor layer 15. The phosphor layer 30 is not formed so as to extend on the second surface side of the semiconductor layer 15, around the metal pillars 23, 24, and on the side surface of the support body 100. The side surface of the phosphor layer 30 is aligned with the side surface of the support body 100 (the side surface of the resin layer 25).

That is, the semiconductor light emitting device 1 of the embodiment is a very small semiconductor light emitting device having a chip size package structure. Thus, in application to e.g. lighting fixtures for illumination, the flexibility of the design of the lighting fixture is enhanced.

Furthermore, the phosphor layer 30 is not uselessly formed on the mounting surface side where light is not extracted to the outside. This can reduce the cost. Furthermore, even without the substrate on the first surface 15a side, heat of the light emitting layer 13 can be dissipated to the mounting substrate side via the p-side interconnection layer 21 and the n-side interconnection layer 22 extending on the second surface side. This provides superior heat dissipation while being a small size.

In a typical flip chip mounting, an LED chip is mounted on a mounting substrate via bumps and the like. Then, a phosphor layer is formed so as to entirely cover the chip. Alternatively, a resin is underfilled between the bumps.

In contrast, according to the embodiment, before mounting, a resin layer 25 different from the phosphor layer 30 is provided around the p-side metal pillar 23 and around the n-side metal pillar 24. Thus, the characteristics suitable for stress relaxation can be provided on the mounting surface side. Furthermore, there is no need of underfilling after mounting, because the resin layer 25 is already provided on the mounting surface side.

On the first surface 15a side, layers designed with priority on e.g. light extraction efficiency, color conversion efficiency, and light distribution characteristics are provided. On the mounting surface side, layers designed with priority on stress relaxation at the mounting time and characteristics for the support body replacing the substrate are provided. For instance, the resin layer 25 has a structure in which the base resin is filled at high density with filler such as silica particles. Thus, the resin layer 25 is adjusted to an appropriate hardness for a support body.

The light emitted from the light emitting layer 13 to the first surface 15a side is injected into the phosphor layer 30. Part of the light excites the phosphor. Thus, for instance, white light is obtained as mixed light of the light of the light emitting layer 13 and the light of the phosphor.

Here, if a substrate exists on the first surface 15a, part of the light is not injected into the phosphor layer 30 but leaks from the side surface of the substrate to the outside. That is, the light with a strong color of the light emitting layer 13 leaks from the side surface of the substrate. This may cause color breakup and color unevenness. For instance, in the top view of the phosphor layer 30, a ring of blue light may appear on the outer edge side.

In contrast, according to the embodiment, there is no substrate between the first surface 15a and the phosphor layer 30. This can prevent color breakup and color unevenness due to leakage of the light with a strong color of the light emitting layer 13 from the substrate side surface.

Furthermore, according to the embodiment, on the side surface 15c of the semiconductor layer 15, the metal film 50 is provided via the insulating film 18. The light directed from the light emitting layer 13 to the side surface 15c of the semiconductor layer 15 is reflected by the metal film 50 and does not leak to the outside. This can prevent color breakup and color unevenness due to light leakage from the side surface side of the semiconductor light emitting device 1 in conjunction with the feature of the absence of the substrate on the first surface 15a side.

Furthermore, according to the embodiment, in the region around the side surface 15c of the semiconductor layer 15, the second reflective part 52 of the metal film 50 is provided opposite to the phosphor layer 30 extending out from above the first surface 15a.

Thus, as shown in FIG. 1B, in the emission light of the phosphors 31, 32 in the end part region of the semiconductor light emitting device 1, the light directed toward the support body 100 therebelow can be reflected by the second reflective part 52 and returned to the phosphor layer 30 side.

This can prevent loss due to absorption of the emission light of the phosphors 31, 32 by the resin layer (black resin) 25 in the end part region of the semiconductor light emitting device 1. Thus, the light extraction efficiency from the phosphor layer 30 side can be increased.

The insulating film 18 provided between the metal film 50 and the side surface 15c of the semiconductor layer 15 prevents diffusion of the metal contained in the metal film 50 into the semiconductor layer 15. This can prevent metal contamination of e.g. GaN of the semiconductor layer 15. Thus, degradation of the semiconductor layer 15 can be prevented.

Furthermore, the insulating films 18, 19 provided between the second reflective part 52 of the metal film 50 and the phosphor layer 30 enhance adhesiveness between the metal film 50 and the base resin of the phosphor layer 30.

The insulating film 18 and the insulating film 19 are inorganic insulating films such as silicon oxide film and silicon nitride film. That is, the first surface 15a and the second surface 15b of the semiconductor layer 15, the side surface 15c of the first semiconductor layer 11, the side surface of the second semiconductor layer 12, and the side surface of the light emitting layer 13 are covered with inorganic insulating film. The inorganic insulating film surrounds the semiconductor layer 15 and blocks the semiconductor layer 15 from e.g. metal and moisture.

Figure 3A:
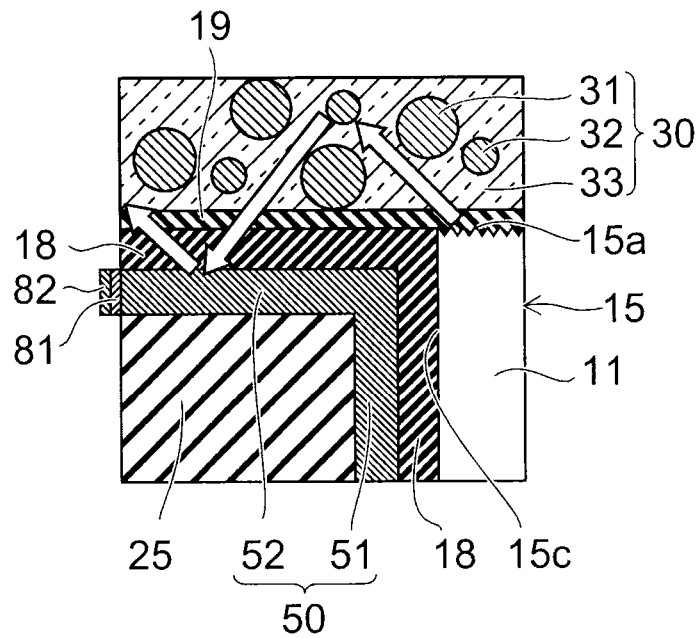
FIGS. 3A and 3B are schematic sectional views of the semiconductor light emitting device of the embodiment.

The second reflective part 52 of the metal film 50 extends to the side surface forming the outer surface of the semiconductor light emitting device 1. The end surface of the second reflective part 52 is exposed at the side surface of the semiconductor light emitting device 1. The end surface of the second reflective part 52 of the metal film 50 is not covered with the insulating film 18 and the resin layer 25, but exposed from the insulating film 18 and the resin layer 25. In the case where the metal film 50 includes e.g. copper, as shown in FIG. 3A, it is desirable to cover the end surface of the second reflective part 52 with a gold (Au) film 82.

The gold film 82 is formed by e.g. plating technique after the semiconductor light emitting device 1 is singulated by dicing. The gold film 82 is provided on the end surface of the second reflective part 52 via a nickel (Ni) film 81 superior in adhesiveness for both copper and gold.

Thus, the gold film 82 superior in corrosion resistance covers the end surface of the second reflective part 52. This can prevent degradation of the metal film 50 due to the progress of the corrosion of copper from the end surface of the second reflective part 52.

Figure 3B:
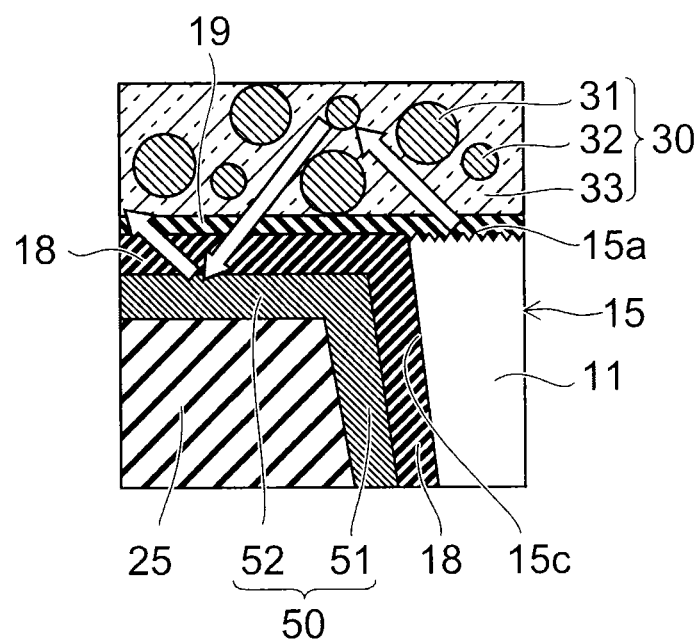

The side surface 15c of the semiconductor layer 15 is not limited to being perpendicular to the first surface 15a. As shown in FIG. 3B, the side surface 15c of the semiconductor layer 15 may be a tapered surface inclined with respect to the first surface 15a. With the first surface 15a facing up, the cross section of the first semiconductor layer 11 is shaped like e.g. an inverted trapezoid.

Next, with reference to FIGS. 6A to 15B, a method for manufacturing the semiconductor light emitting device 1 is described.

Figure 6A:
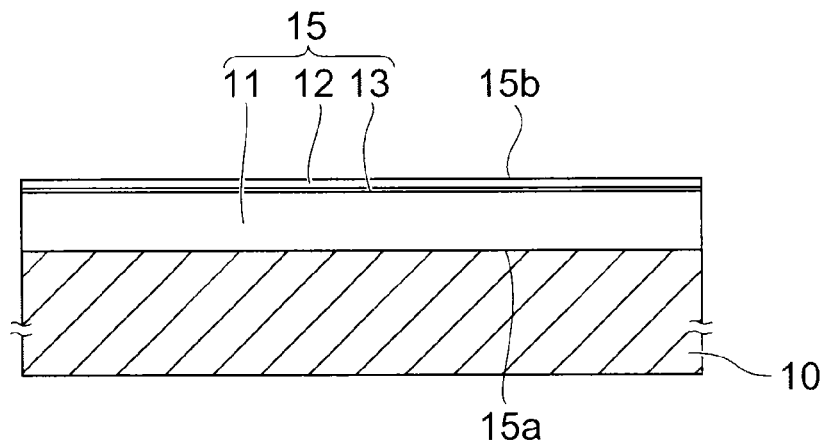
FIGS. 6A to 14B are schematic sectional views showing a method for manufacturing the semiconductor light emitting device of the embodiment.

FIG. 6A is a sectional view showing a semiconductor layer 15 formed on the major surface of a substrate 10. For instance, by MOCVD (metal organic chemical vapor deposition) technique, a first semiconductor layer 11, a light emitting layer 13, and a second semiconductor layer 12 are sequentially epitaxially grown on the major surface of the substrate 10.

In the semiconductor layer 15, the surface on the substrate 10 side is a first surface 15a, and the surface on the opposite side of the substrate 10 is a second surface 15b.

The substrate 10 is e.g. a silicon substrate. Alternatively, the substrate 10 may be a sapphire substrate. The semiconductor layer 15 is e.g. a nitride semiconductor layer including gallium nitride (GaN).

The first semiconductor layer 11 includes e.g. a buffer layer provided on the major surface of the substrate 10, and an n-type GaN layer provided on the buffer layer. The second semiconductor layer 12 includes e.g. a p-type AlGaN layer provided on the light emitting layer 13, and a p-type GaN layer provided on the p-type AlGaN layer. The light emitting layer 13 has e.g. an MQW (multiple quantum well) structure.

Figure 6B:
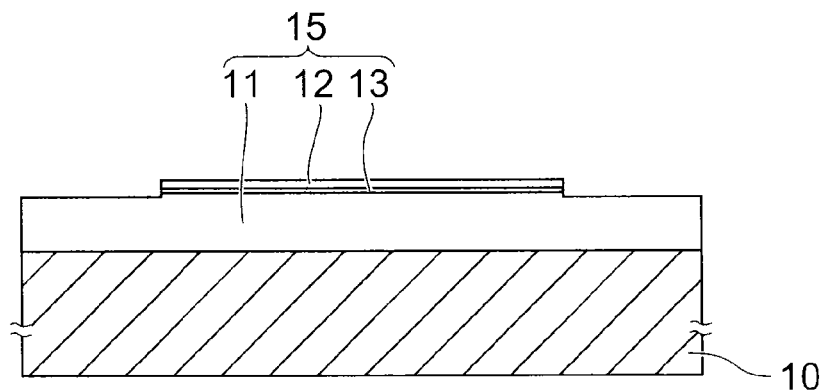

FIG. 6B shows the state in which the second semiconductor layer 12 and the light emitting layer 13 are selectively removed. For instance, by RIE (reactive ion etching) technique, the second semiconductor layer 12 and the light emitting layer 13 are selectively etched to expose the first semiconductor layer 11.

Figure 7A:
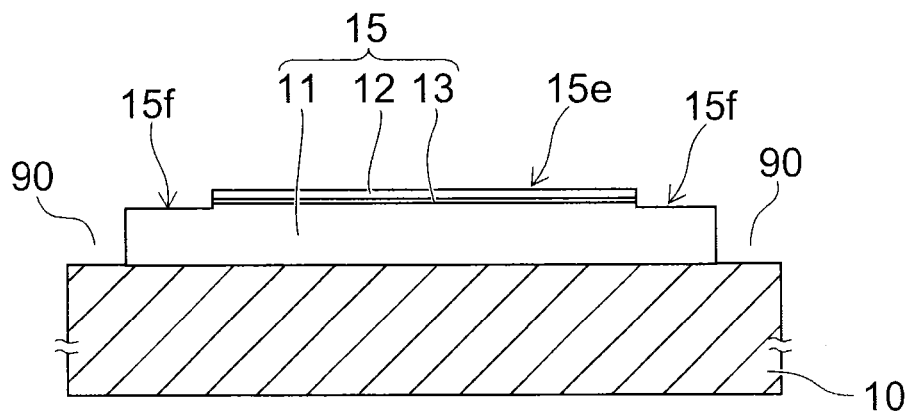

Next, as shown in FIG. 7A, the first semiconductor layer 11 is selectively removed to form a trench 90. On the major surface of the substrate 10, the semiconductor layer 15 is divided into a plurality by the trench 90. The trench 90 penetrates through the semiconductor layer 15 and reaches the substrate 10. Depending on the etching condition, the major surface of the substrate 10 may be slightly etched, and the bottom surface of the trench 90 may be set back below the interface between the substrate 10 and the semiconductor layer 15. Here, the trench 90 may be formed after the p-side electrode 16 and the n-side electrode 17 are formed.

Figure 7B:
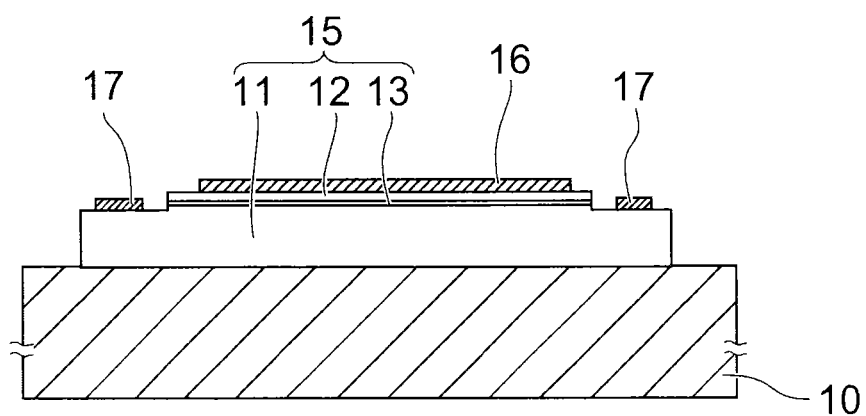

As shown in FIG. 7B, a p-side electrode 16 is formed on the surface of the second semiconductor layer 12. Furthermore, an n-side electrode 17 is formed on the surface of the first semiconductor layer 11 in the region where the second semiconductor layer 12 and the light emitting layer 13 are selectively removed.

The p-side electrode 16 and the n-side electrode 17 are formed by e.g. sputtering or evaporation technique. Either of the p-side electrode 16 and the n-side electrode 17 may be formed previously. Alternatively, the p-side electrode 16 and the n-side electrode 17 may be formed simultaneously from the same material.

The p-side electrode 16 is formed in the region where the light emitting layer 13 is stacked. The p-side electrode 16 includes a reflective film reflecting the emission light of the light emitting layer 13. For instance, the p-side electrode 16 includes silver, silver alloy, aluminum, or aluminum alloy. In order to prevent sulfidation and oxidation of the reflective film, the p-side electrode 16 includes a metal protective film (barrier metal).

Next, as shown in FIG. 8A, an insulating film 18 is formed so as to cover the structural body provided on the substrate 10. The insulating film 18 covers the second surface of the semiconductor layer 15, the p-side electrode 16, and the n-side electrode 17. Furthermore, the insulating film 18 covers the side surface 15c of the semiconductor layer 15 continued from the first surface 15a. The insulating film 18 is formed also on the surface of the substrate 10 at the bottom surface of the trench 90.

The insulating film 18 is e.g. a silicon oxide film or silicon nitride film formed by CVD (chemical vapor deposition) technique. In the insulating film 18, as shown in FIG. 8B, first openings 18a and a second opening 18b are formed by e.g. wet etching using a resist mask. The first opening 18a reaches the p-side electrode 16. The second opening 18b reaches the n-side electrode 17.

Next, as shown in FIG. 8B, a foundation metal film 60 is formed on the surface of the insulating film 18, the inner wall (sidewall and bottom surface) of the first opening 18a, and the inner wall (sidewall and bottom surface) of the second opening 18b. As described above with reference to FIG. 5, the foundation metal film 60 includes an aluminum film 61, a titanium film 62, and a copper film 63. The foundation metal film 60 is formed by e.g. sputtering technique.

Figure 9A:
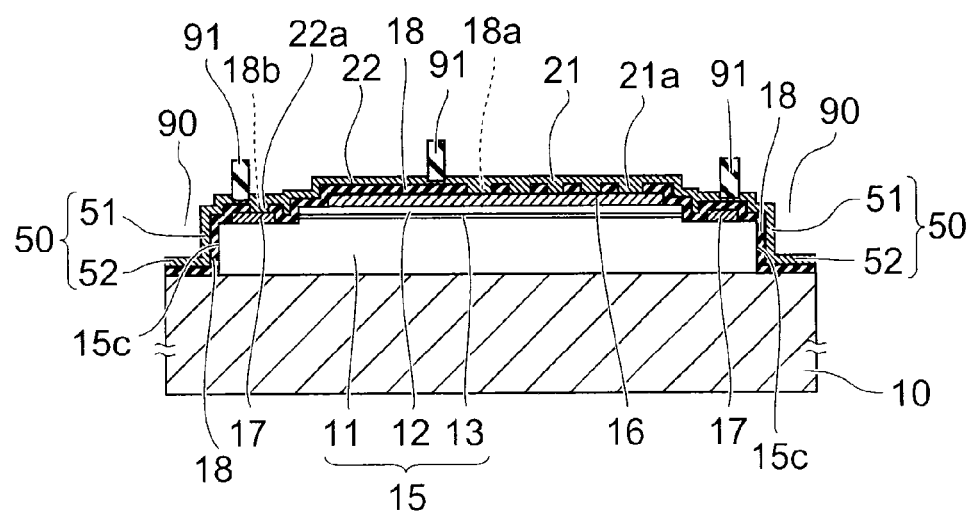

Next, on the foundation metal film 60, a resist mask 91 shown in FIG. 9A is selectively formed. Then, by electrolytic copper plating technique using the copper film 63 of the foundation metal film 60 as a seed layer, a p-side interconnection layer 21, an n-side interconnection layer 22, and a metal film 50 are formed.

The p-side interconnection layer 21 is formed also in the first opening 18a and electrically connected to the p-side electrode 16. The n-side interconnection layer 22 is formed also in the second opening 18b and electrically connected to the n-side electrode 17.

Figure 9B:
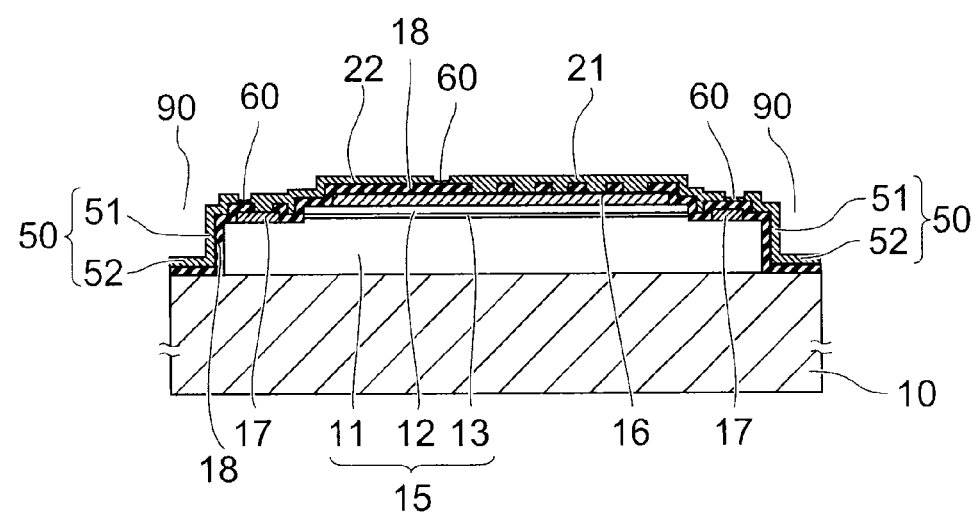

The resist mask 91 is removed as shown in FIG. 9B by using e.g. solvent or oxygen plasma.

Figure 10A:
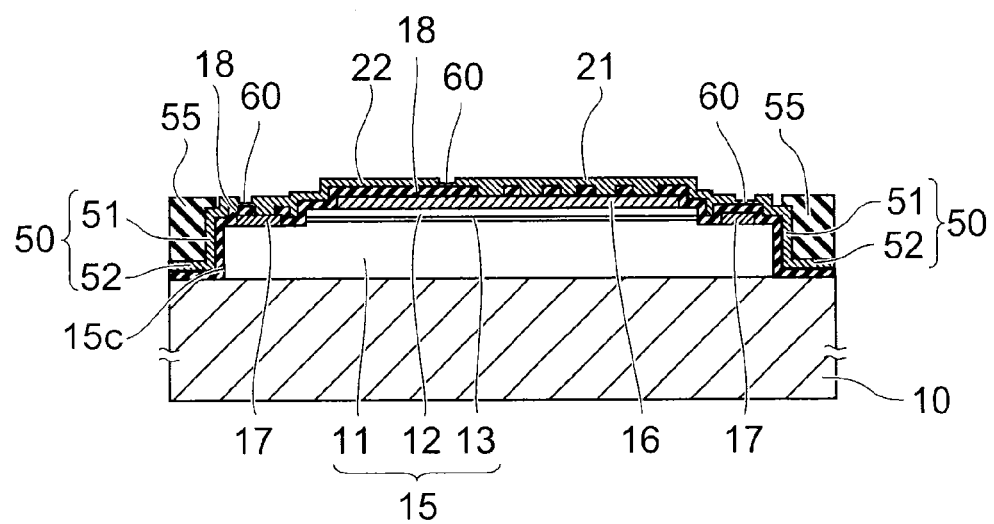

Next, a resin layer is formed on the entire surface of the p-side interconnection layer 21, the n-side interconnection layer 22, and the metal film 50. Then, as shown in FIG. 10A, the resin layer 55 is left on the metal film 50.

The resin layer 55 is made of e.g. photosensitive polyimide resin. By selective light exposure and development after the light exposure on the resin layer 55 formed on the entire surface, the resin layer 55 is left on the metal film 50.

The resin layer 55 is left in the region around the side surface 15c of the semiconductor layer 15 as a mask layer covering the metal film 50.

The resin layer 55 is formed when the unevenness (step difference) is small before the p-side metal pillar 23 and the n-side metal pillar 24 are formed. This facilitates lithography on the resin layer 55.

Figure 10B:
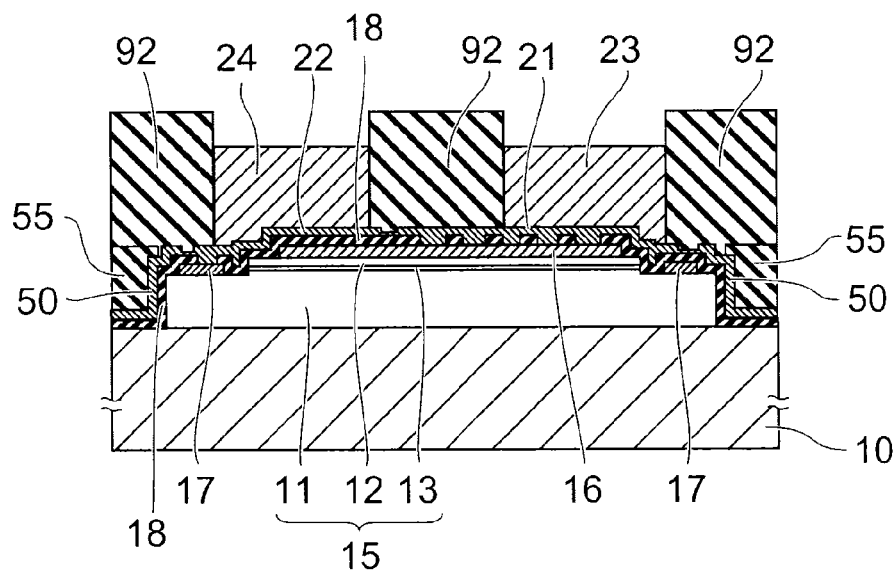

Next, on the structural body shown in FIG. 10A, a resist mask 92 shown in FIG. 10B is selectively formed. Then, by electrolytic copper plating technique using the p-side interconnection layer 21 and the n-side interconnection layer 22 as a seed layer, a p-side metal pillar 23 and an n-side metal pillar 24 are formed.

The p-side metal pillar 23 is formed on the p-side interconnection layer 21. The p-side interconnection layer 21 and the p-side metal pillar 23 are made of the same copper material and integrated together. The n-side metal pillar 24 is formed on the n-side interconnection layer 22. The n-side interconnection layer 22 and the n-side metal pillar 24 are made of the same copper material and integrated together.

The metal film 50 and the resin layer 55 are covered with the resist mask 92. Thus, no metal pillar is provided on the metal film 50 and the resin layer 55.

Figure 11A:
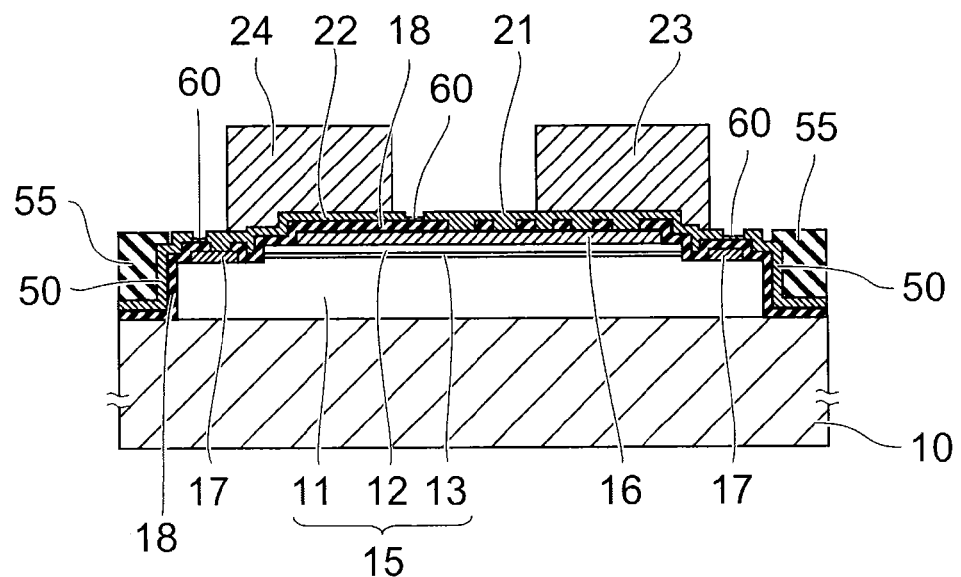

The resist mask 92 is removed as shown in FIG. 11A by using e.g. solvent or oxygen plasma.

At this time, the p-side interconnection layer 21 and the n-side interconnection layer 22 are connected via the foundation metal film 60. Furthermore, the p-side interconnection layer 21 and the metal film 50 are also connected via the foundation metal film 60. The n-side interconnection layer 22 and the metal film 50 are also connected via the foundation metal film 60.

Thus, in the next step, the foundation metal film 60 between the p-side interconnection layer 21 and the n-side interconnection layer 22, the foundation metal film 60 between the p-side interconnection layer 21 and the metal film 50, and the foundation metal film 60 between the n-side interconnection layer 22 and the metal film 50 are removed by etching.

Figure 11B:
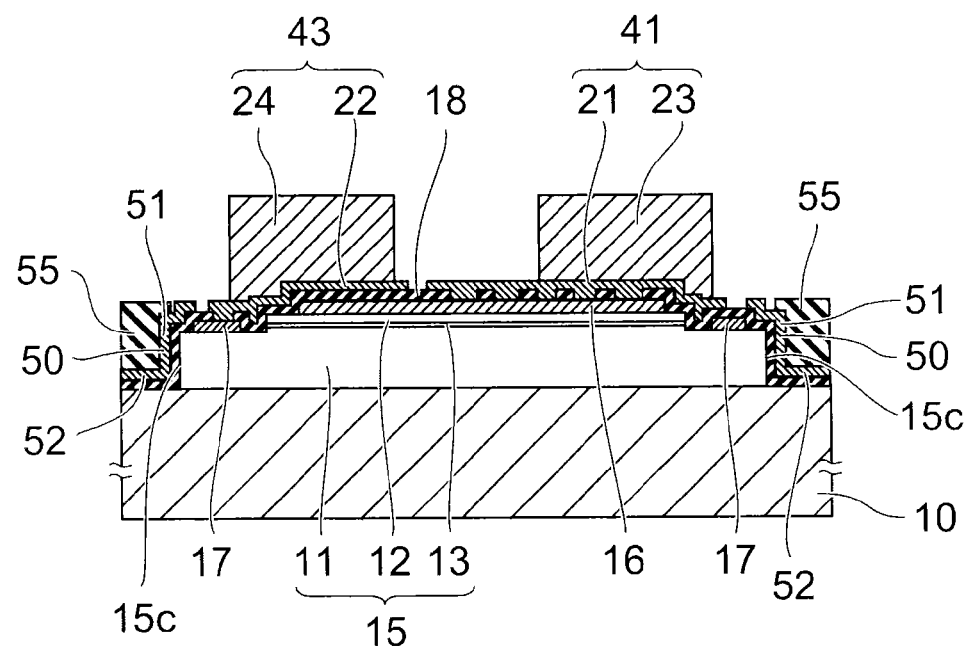

Accordingly, as shown in FIG. 11B, the electrical connection between the p-side interconnection layer 21 and the n-side interconnection layer 22, the electrical connection between the p-side interconnection layer 21 and the metal film 50, and the electrical connection between the n-side interconnection layer 22 and the metal film 50 are disconnected.

At this time, the first reflective part 51 provided on the side surface 15c of the semiconductor layer 15 via the insulating film 18, and the second reflective part 52 provided on the substrate 10 via the insulating film 18, are covered with the resin layer 55, and thus not etched.

The metal film 50 formed in the region around the side surface 15c of the semiconductor layer 15 is electrically floating. Thus, the metal film 50 does not function as an electrode, but functions as a reflective film. The function of the metal film 50 as a reflective film is ensured as long as the metal film 50 includes at least the aluminum film 61.

That is, in the step of FIG. 8B, the foundation metal film 60 including the aluminum film 61 is formed. Then, the metal film 50 may be constituted only from the foundation metal film 60 without forming a plating film in the region around the side surface 15c of the semiconductor layer 15. In the step of FIG. 9A, if the resist mask 91 is formed in the region around the side surface 15c of the semiconductor layer 15, no plating film is formed in that region.

If the metal film 50 is made only of the foundation metal film 60, the metal film 50 may be eliminated at the time of etching for removing the unnecessary portion of the foundation metal film 60 for the aforementioned electrical disconnection between the interconnection layers. However, as shown in FIG. 11B, the metal film 50 is covered with the resin layer 55. Then, even the metal film 50 made only of the foundation metal film 60 can be reliably left.

If the second reflective part 52 of the metal film 50 is thin, the metal film to be cut in the end part of the semiconductor light emitting device 1 is thin at the time of singulation in the step described later. This facilitates dicing. Furthermore, this can provide a reliable semiconductor light emitting device 1 free from damage at the diced side surface.

Figure 12A:
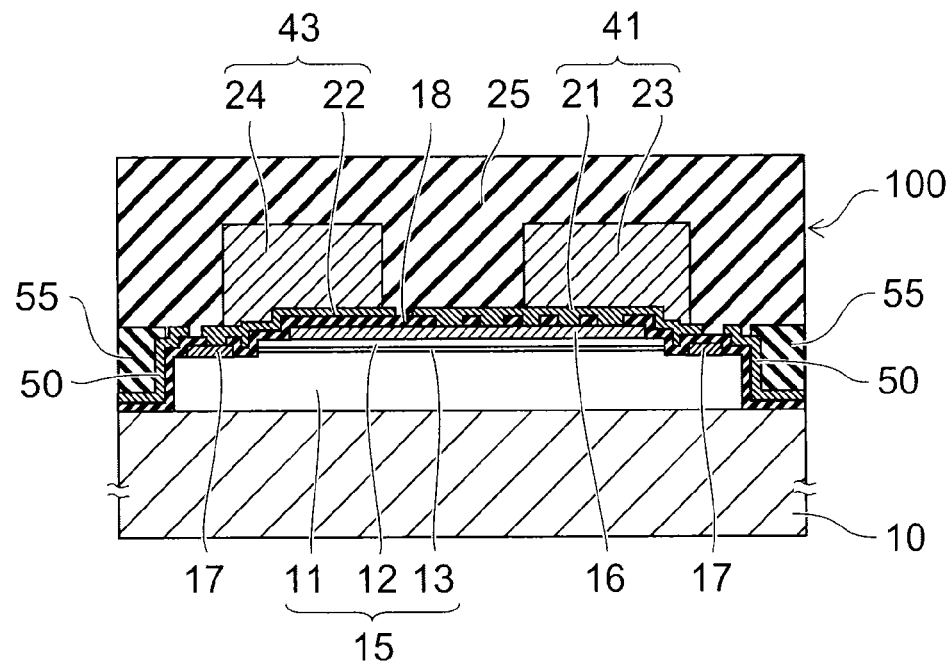

Next, on the structural body shown in FIG. 11B, a resin layer 25 shown in FIG. 12A is formed. The resin layer 25 covers the p-side interconnection part 41 and the n-side interconnection part 43. Furthermore, the resin layer 25 is formed also on the resin layer 55 provided on the metal film 50.

The resin layer 25 constitutes a support body 100 in conjunction with the p-side interconnection part 41 and the n-side interconnection part 43. With the semiconductor layer 15 supported by the support body 100, the substrate 10 is removed.

For instance, the substrate 10 being a silicon substrate is removed by wet etching or dry etching. Alternatively, in the case where the substrate 10 is a sapphire substrate, the substrate 10 can be removed by laser lift-off technique.

The semiconductor layer 15 epitaxially grown on the substrate 10 may have a large internal stress. Furthermore, the p-side metal pillar 23, the n-side metal pillar 24, and the resin layer 25 are made of a softer material than the semiconductor layer 15 made of e.g. GaN-based material. Thus, even if the internal stress due to epitaxial growth is instantaneously released at the time of stripping the substrate 10, the p-side metal pillar 23, the n-side metal pillar 24, and the resin layer 25 absorb the stress. This can avoid breakage of the semiconductor layer 15 in the process of removing the substrate 10.

Figure 12B:
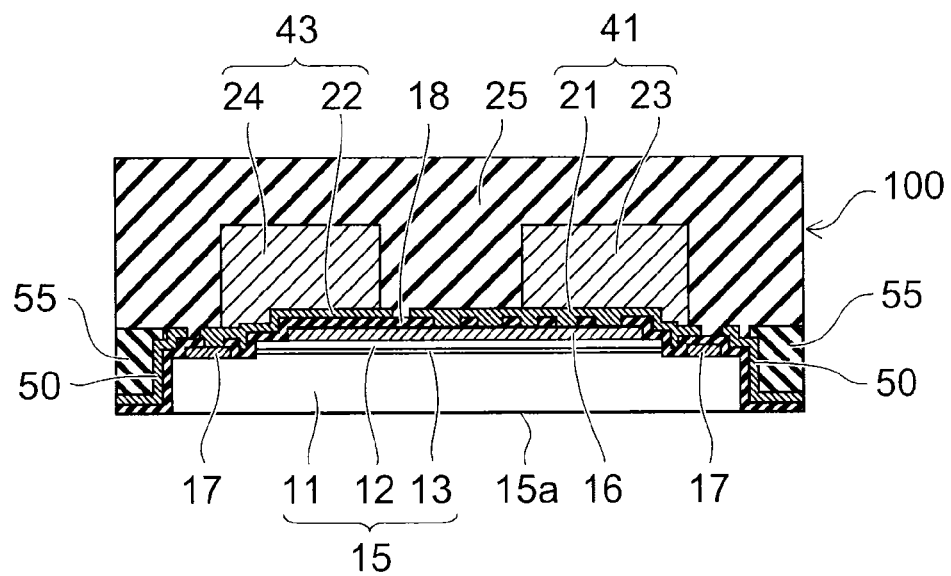

By the removal of the substrate 10, as shown in FIG. 12B, the first surface 15a of the semiconductor layer 15 is exposed. At the exposed first surface 15a, a fine unevenness is formed. For instance, the first surface 15a is wet etched with e.g. KOH (potassium hydroxide) aqueous solution or TMAH (tetramethylammonium hydroxide). In this etching, a difference occurs in etching rate depending on the crystal surface orientation. Thus, an unevenness can be formed at the first surface 15a. By forming an unevenness at the first surface 15a, the efficiency of extracting the emission light of the light emitting layer 13 can be improved.

Figure 13A:
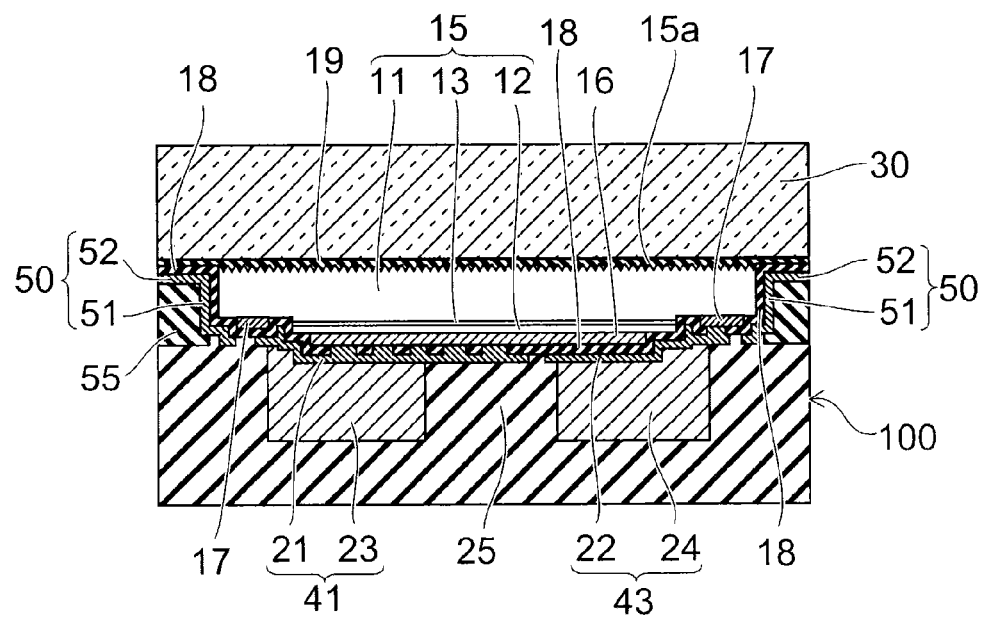

On the first surface 15a, as shown in FIG. 13A, a phosphor layer 30 is formed via an insulating film 19. The phosphor layer 30 is formed by a method such as printing, potting, molding, and compression molding. The insulating film 19 enhances adhesiveness between the semiconductor layer 15 and the phosphor layer 30.

Alternatively, the phosphor layer 30 may be made of a sintered phosphor in which a phosphor is sintered via a binder, and the phosphor layer 30 may be bonded via an insulating film 19.

The phosphor layer 30 is formed also on the region around the side surface 15c of the semiconductor layer 15. In the region around the side surface 15c of the semiconductor layer 15, the aforementioned resin layer 55 is left. On the resin layer 55, the phosphor layer 30 is formed via the metal film 50 and the insulating films 18 and 19.

Figure 13B:
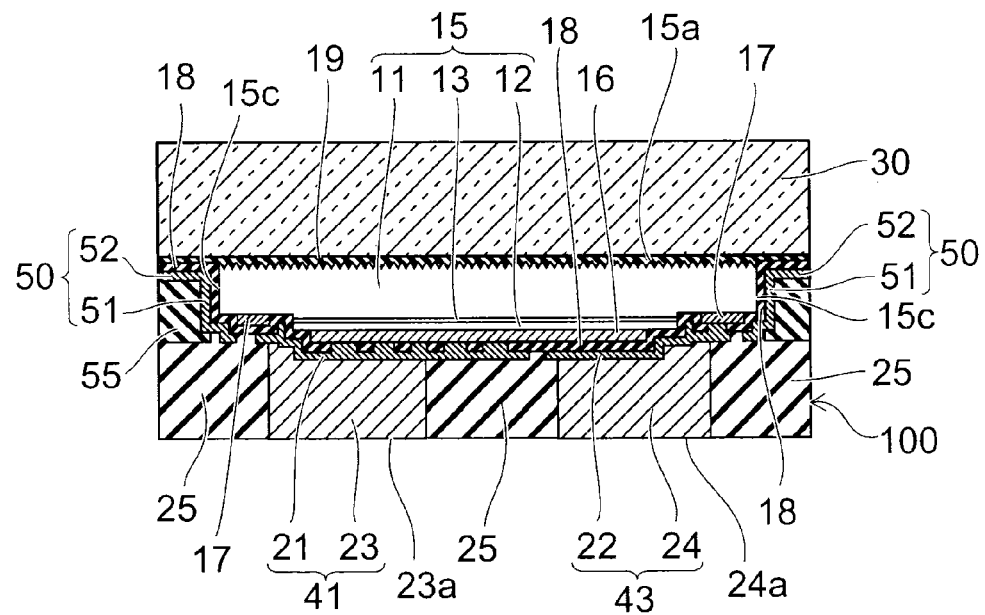

After forming the phosphor layer 30, the surface of the resin layer 25 (the lower surface in FIG. 13A) is ground. Thus, as shown in FIG. 13B, the p-side metal pillar 23 and the n-side metal pillar 24 are exposed from the resin layer 25. The exposed surface of the p-side metal pillar 23 constitutes a p-side external terminal 23a. The exposed surface of the n-side metal pillar 24 constitutes an n-side external terminal 24a.

Next, in the region where the aforementioned trench 90 dividing a plurality of semiconductor layers 15 is formed, the structural body shown in FIG. 13B is cut. That is, the phosphor layer 30, the insulating film 19, the insulating film 18, the second reflective part 52 of the metal film 50, the resin layer 55, and the resin layer 25 are cut. These are cut by e.g. a dicing blade or laser light. The semiconductor layer 15 does not exist in the dicing region. Thus, the semiconductor layer 15 is not damaged by dicing.

The aforementioned steps before singulation are performed in the wafer state including numerous semiconductor layers 15. The wafer is singulated as a semiconductor light emitting device 1 including at least one semiconductor layer 15. Here, the semiconductor light emitting device 1 may have a single chip structure including one semiconductor layer 15, or a multi-chip structure including a plurality of semiconductor layers 15.

The aforementioned steps before singulation are performed collectively in the wafer state. Thus, there is no need of formation of a interconnection layer, formation of a pillar, packaging with a resin layer, and formation of a phosphor layer for each singulated device. This can significantly reduce the cost.

The support body 100 and the phosphor layer 30 are cut after being formed in the wafer state. Thus, the side surface of the phosphor layer 30 is aligned with the side surface of the support body 100 (the side surface of the resin layer 55 and the side surface of the resin layer 25). These side surfaces form a side surface of the singulated semiconductor light emitting device 1. Thus, in conjunction with the absence of the substrate 10, a small semiconductor light emitting device 1 having a chip size package structure can be provided. After dicing, the end surface of the second reflective part 52 of the metal film 50 is not covered with the insulating film 18 and the resin layers 55, 25, but exposed from the insulating film 18 and the resin layers 55, 25.

In the step of FIG. 11B, after removing the unnecessary portion of the foundation metal film 60, the resin layer 55 may be removed. After removing the resin layer 55, the resin layer 25 is formed in the step of FIG. 12A. As shown in FIG. 1A, this results in a structure in which the region provided with the metal film 50 is also filled with the resin layer 25.

Alternatively, the resin layer 55 may be left without removal. As shown in FIG. 13B, this results in a structure in which the resin layer 55 different from the resin layer 25 on the mounting surface side is provided in the region around the side surface 15c of the semiconductor layer 15.

The resin layer 25 is controlled to have characteristics (hardness) suitable for reinforcing the metal pillars 23, 24 and forming the support body 100 by filling e.g. epoxy resin, silicone resin, or fluororesin with filler.

On the other hand, the resin layer 55 provided in the region around the side surface 15c of the semiconductor layer 15 can be provided with characteristics different from those of the resin layer 25. For instance, the resin layer 55 can be made of a material superior in water resistance to the resin layer 25.

In the semiconductor light emitting device 1 having a planar size close to the chip size, the side surface 15c of the semiconductor layer 15 has a shorter distance to outside air than the first surface 15a and the second surface 15b. In the region around the side surface 15c, the resin layer 55 superior in water resistance is provided. This can protect the side surface 15c from penetration of moisture.

Figure 15A:
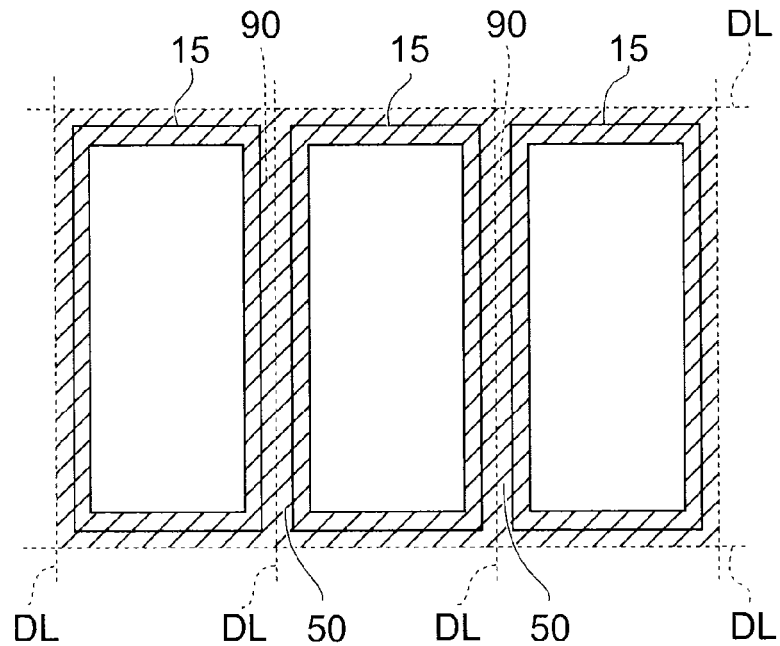
FIGS. 15A and 15B are schematic plan views showing the method for manufacturing the semiconductor light emitting device of the embodiment.

FIG. 15A shows a planar pattern of the metal film 50 formed in the wafer state. In FIG. 15A, the dashed line represents a dicing line DL.

The metal film 50 is formed in the region (trench 90) between the semiconductor layers 15 adjacent on the substrate 10. The resin layer 55 is formed so as to cover the metal film 50.

For instance, the resin layer 55 is made of polyimide, and the surface of the metal film 50 in contact with the resin layer 55 is made of copper. Then, there is concern about peeling of the resin layer 55 from the metal film 50.

Figure 15B:
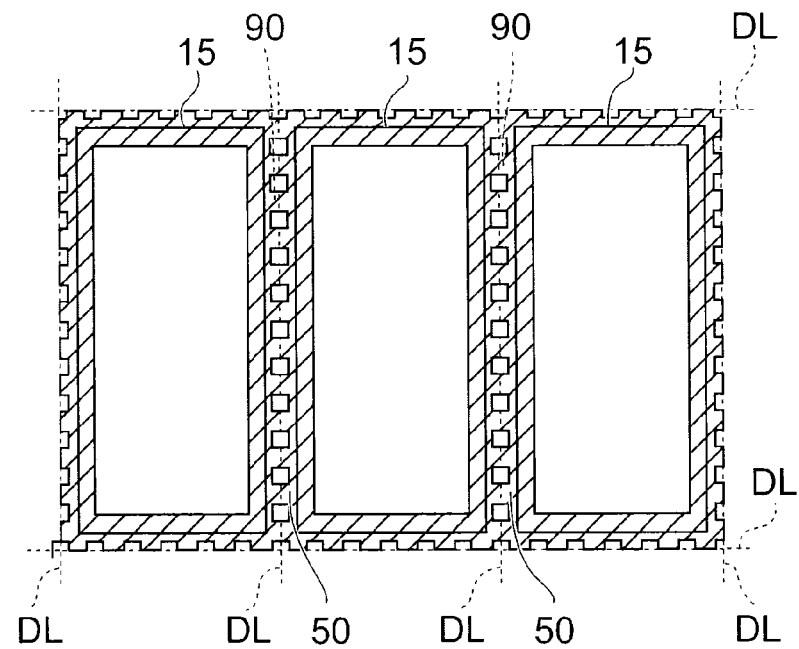

Thus, instead of blanketly forming the metal film 50 on the entire surface of the region (trench 90) between the semiconductor layers 15, the metal film 50 is formed in the region (trench 90) between the semiconductor layers 15 with the coverage ratio of the metal film 50 made lower than 100% as shown in FIG. 15B. This can make the resin layer 55 less prone to peeling from the metal film 50.

In the region (trench 90) between the semiconductor layers 15, the resin layer 55 bites into the opening (the portion exposing the insulating film 18) lacking the metal film 50. This can enhance adhesiveness between the resin layer 55 and the metal film 50.

By patterning of the resist mask used to form the metal film 50, the coverage ratio of the metal film 50 can be adjusted.

Figure 14A:
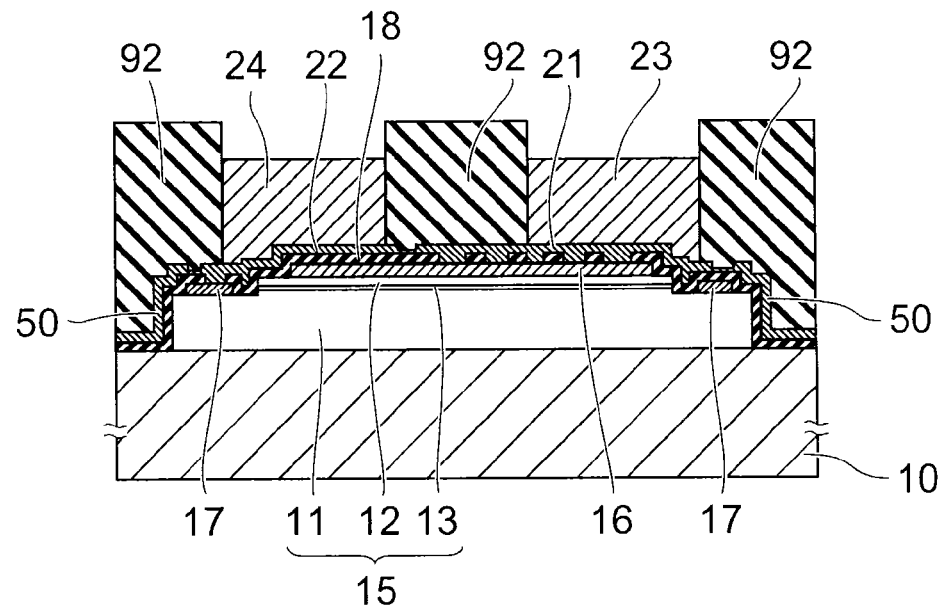
Figure 14B:
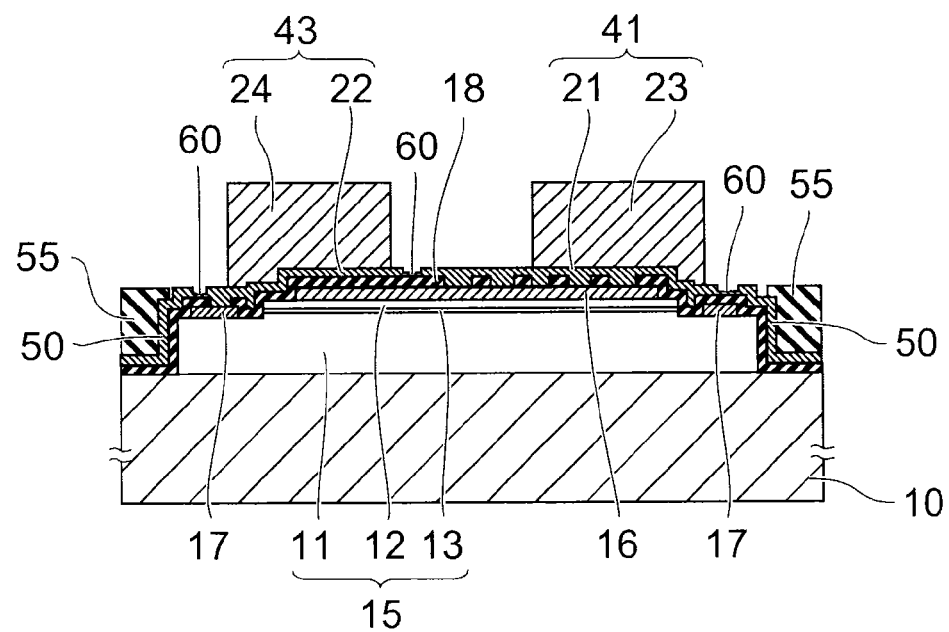

Before forming the resin layer 55, as shown in FIG. 14B, the p-side metal pillar 23 and the n-side metal pillar 24 may be formed previously as shown in FIG. 14A.

Then, after removing the resist mask 92, as shown in FIG. 14B, the metal film 50 is covered with a resin layer 55.

(Second Embodiment)

Figure 4A:
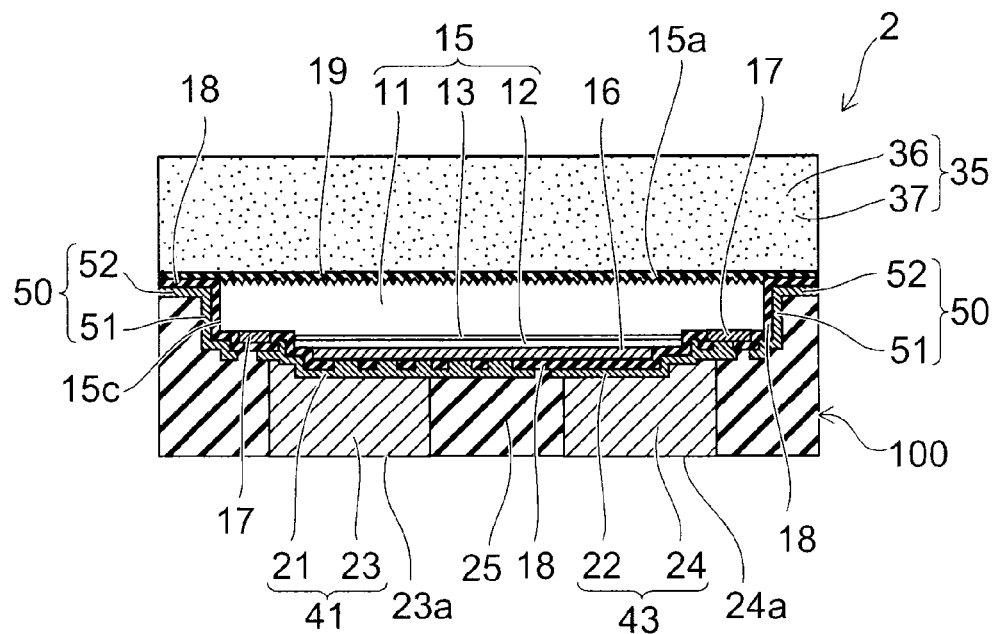
FIGS. 4A and 4B are schematic sectional views of semiconductor light emitting devices of embodiments.

The optical layer provided on the first surface 15a side of the semiconductor layer 15 is not limited to a phosphor layer. As shown in FIG. 4A, the optical layer may be a scattering layer 35.

The scattering layer 35 includes a plurality of particulate scatterers (e.g., titanium compound) 36 for scattering the emission light of the light emitting layer 13, and a binder (e.g., resin layer) 37 for integrating the plurality of scatterers 36 and transmitting the emission light of the light emitting layer 13.

The planar size of the scattering layer 35 is larger than the planar size of the semiconductor layer 15. The scattering layer 35 is provided also on the region around the side surface 15c of the semiconductor layer 15.

Also in the semiconductor light emitting device 2 of this second embodiment, in the region around the side surface 15c of the semiconductor layer 15, the second reflective part 52 of the metal film 50 is provided opposite to the scattering layer 35 extending out from above the first surface 15a.

Thus, in the end part region of the semiconductor light emitting device 2, the light scattered by the scatterers 36 and directed toward the support body 100 therebelow can be reflected by the second reflective part 52 and returned to the scattering layer 35 side.

This can prevent loss due to absorption of the scattered light of the scatterers 36 by the resin layer (black resin) 25 in the end part region of the semiconductor light emitting device 2. Thus, the light extraction efficiency from the scattering layer 35 side can be increased.

(Third Embodiment)

Figure 4B:
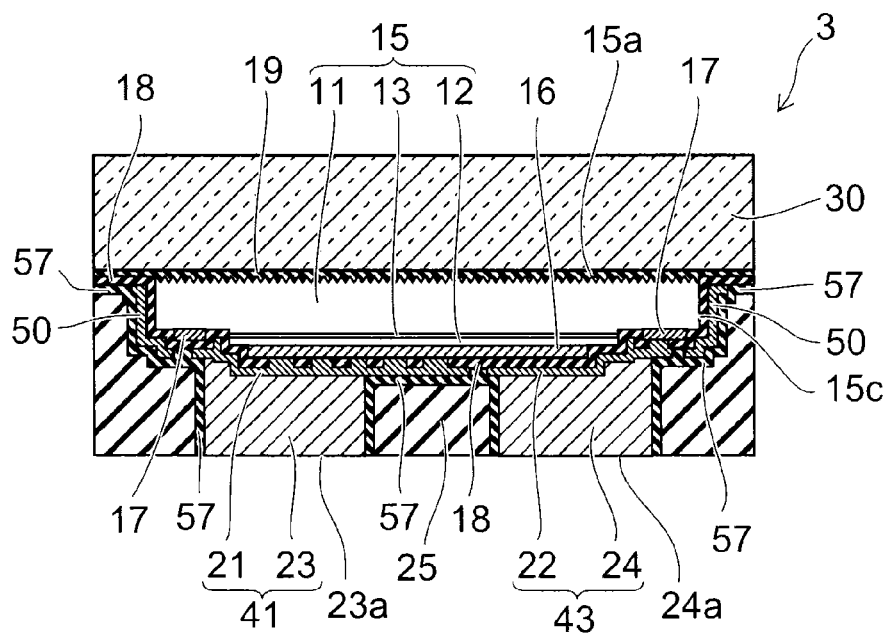

Alternatively, as shown in FIG. 4B, instead of the metal film, a white resin film 57 may be provided in the region around the side surface 15c of the semiconductor layer 15. The white resin film 57 is reflective to the emission light of the light emitting layer 13, the emission light of the phosphors, and the scattered light of the scatterers.

In the region around the side surface 15c of the semiconductor layer 15, the white resin film 57 is opposed via the insulating films 18 and 19 to the phosphor layer 30 extending out from above the first surface 15a.

The white resin film 57 is provided also on the surface of the metal film 50, the surface of the p-side interconnection layer 21, the surface of the n-side interconnection layer 22, the side surface of the p-side metal pillar 23, and the side surface of the n-side metal pillar 24.

Also in the semiconductor light emitting device 3 of this third embodiment, in the region around the side surface 15c of the semiconductor layer 15, the white resin film 57 functioning as a reflective film is provided opposite to the phosphor layer 30 extending out from above the first surface 15a.

Thus, in the emission light of the phosphors or the scattered light of the scatterers in the end part region of the semiconductor light emitting device 3, the light directed toward the support body 100 therebelow can be reflected by the white resin film 57 and returned to the optical layer side.

This can prevent loss due to absorption of the emission light of the phosphors or the scattered light of the scatterers by the resin layer (black resin) 25 in the end part region of the semiconductor light emitting device 3. Thus, the light extraction efficiency from the optical layer side can be increased.

(Fourth Embodiment)

Figure 16A:
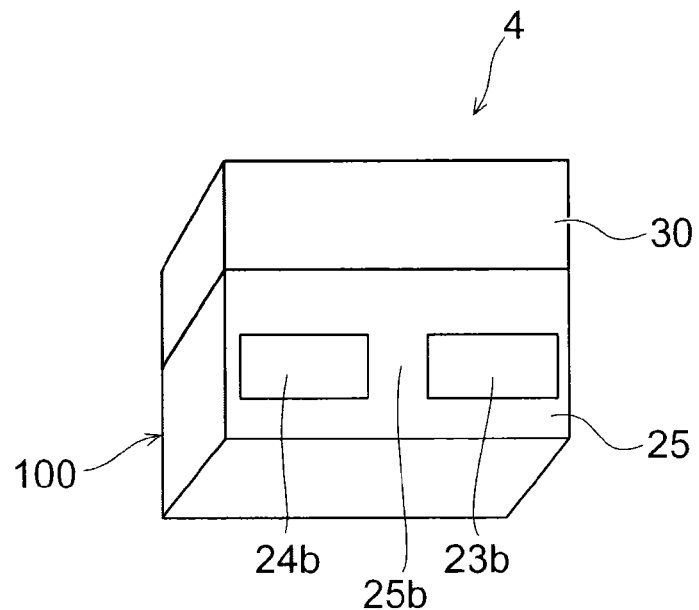
FIGS. 16A and 16B are schematic views of a semiconductor light emitting device of an embodiment.
Figure 16B:
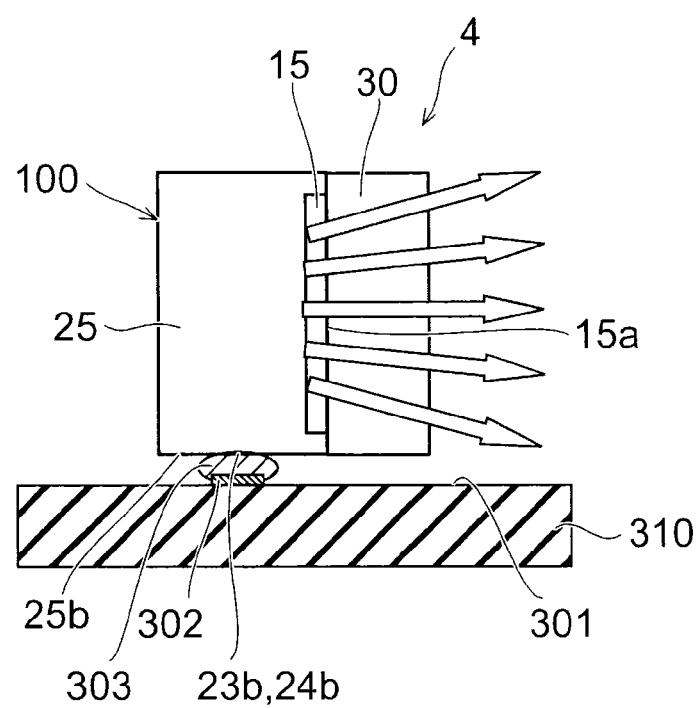

The embodiments described above are also applicable to a side view type semiconductor light emitting device 4 shown in FIGS. 16A and 16B.

The semiconductor light emitting device 4 of the fourth embodiment is different from the above embodiments in the exposed surface of the metal pillars 23, 24 exposed from the resin layer 25 and serving for external connection. The rest of the configuration is the same as that of the semiconductor light emitting devices of the above embodiments.

FIG. 16A is a schematic perspective view of the semiconductor light emitting device 4 of the fourth embodiment.

FIG. 16B is a schematic sectional view of a light emitting module having a configuration in which the semiconductor light emitting device 4 of the fourth embodiment is mounted on a mounting substrate 310.

Part of the side surface of the p-side metal pillar 23 is exposed from the resin layer 25 at a third surface 25b having a surface orientation different from that of the first surface 15a of the semiconductor layer 15 and the second surface 15b on the opposite side thereof. The exposed surface functions as a p-side external terminal 23b for mounting to an external mounting substrate 310.

For instance, the third surface 25b is a surface generally perpendicular to the first surface 15a and the second surface 15b of the semiconductor layer 15. The resin layer 25 has e.g. four rectangular side surfaces. One of the side surfaces is the third surface 25b.

At the same third surface 25b, part of the side surface of the n-side metal pillar 24 is exposed from the resin layer 25. The exposed surface functions as an n-side external terminal 24b for mounting to the external mounting substrate 310.

In the p-side metal pillar 23, the portion other than the p-side external terminal 23b exposed at the third surface 25b is covered with the resin layer 25. In the n-side metal pillar 24, the portion other than the n-side external terminal 24b exposed at the third surface 25b is covered with the resin layer 25.

As shown in FIG. 16B, the semiconductor light emitting device 4 is mounted in a posture with the third surface 25b faced to the mounting surface 301 of the substrate 310. The p-side external terminal 23b and the n-side external terminal 24b exposed at the third surface 25b are bonded via solder 303 to a pad 302 provided on the mounting surface 301. On the mounting surface 301 of the substrate 310, for instance, an interconnection pattern connected to an external circuit is provided. The pad 302 is connected to the interconnection pattern.

The third surface 25b is generally perpendicular to the first surface 15a serving as a major light emission surface. Thus, in the posture with the third surface 25b faced to the mounting surface 301 side, the first surface 15a is directed in the horizontal direction parallel to, or an inclined direction with respect to the mounting surface 301. That is, the semiconductor light emitting device 4 is what is called a side view type semiconductor light emitting device, and emits light in the horizontal direction parallel to, or an oblique direction with respect to the mounting surface 301.

According to the embodiments, the metal film is covered with the resin layer.

According to the embodiments, the first resin layer primarily includes epoxy resin, silicone resin, or fluororesin, and the second resin layer primarily includes polyimide resin.

According to the embodiments, the resin layer has a light blocking property for the emission light of the light emitting layer.

According to the embodiments, the semiconductor light emitting device further includes a third insulating film provided between the first surface and the optical layer.

According to the embodiments, the optical layer is a phosphor layer including a plurality of phosphors excited by the emission light of the light emitting layer and emitting light of a wavelength different from that of the emission light of the light emitting layer, and a binder integrating the plurality of phosphors and transmitting the emission light of the light emitting layer and the emission light of the phosphors.

According to the embodiments, the optical layer is a scattering layer including a plurality of scatterers scattering the emission light of the light emitting layer, and a binder integrating the plurality of scatterers and transmitting the emission light of the light emitting layer.

According to the embodiments, each of the p-side metal pillar and the n-side metal pillar includes an externally connectable end part juxtaposed in the same surface.

According to the embodiments, the side surface of the optical layer is aligned with the side surface of the support body.

According to the embodiments, the metal film includes copper, and a gold film is provided on the end surface of the second reflective part of the metal film.

According to the embodiments, the p-side interconnection part, the n-side interconnection part, and the metal film are formed by plating technique using a seed layer formed on the second surface side. With the metal film covered with a mask layer, the seed layer formed between the p-side interconnection part and the n-side interconnection part, the seed layer formed between the p-side interconnection part and the metal film, and the seed layer formed between the n-side interconnection part and the metal film are removed by etching.

According to the embodiments, the coverage ratio of the metal film in the region around the side surface of the semiconductor layer is made lower than 100%.

According to the embodiments, the p-side interconnection part, the n-side interconnection part, and the metal film are formed by plating using a seed layer formed on the second surface side, and with the metal film covered with a mask layer, the seed layer formed between the p-side interconnection part and the n-side interconnection part, the seed layer formed between the p-side interconnection part and the metal film, and the seed layer formed between the n-side interconnection part and the metal film are removed by etching.

According to the embodiments, coverage ratio of the metal film in the region around the side surface of the semiconductor layer is made lower than 100%.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor light emitting device comprising:
   a semiconductor layer having a first surface and a second surface on an opposite side from the first surface, and including a light emitting layer;
   a p-side electrode provided on the semiconductor layer on the second surface side;
   an n-side electrode provided on the semiconductor layer on the second surface side;
   a support body provided on the second surface side and including a p-side interconnection part connected to the p-side electrode, an n-side interconnection part connected to the n-side electrode, and a resin layer provided between the p-side interconnection part and the n-side interconnection part;
   an optical layer provided on the first surface side, having a larger planar size than the semiconductor layer, and being transmissive to emission light of the light emitting layer;
   a first insulating film provided on a side surface of the semiconductor layer continued from the first surface; and
   a metal film including a first reflective part and a second reflective part, the first reflective part provided on the first insulating film which is interposed between the first reflective part and the side surface of the semiconductor layer, the second reflective part provided below the optical layer at a region around the side surface of the semiconductor layer, the second reflective part extending toward a side surface of the device, an end of the second reflective part being aligned with the side surface of the device.

2. The device according to claim 1, further comprising:
   a second insulating film provided between the second reflective part of the metal film and the optical layer.

3. The device according to claim 1, wherein the metal film is separated from the p-side interconnection part and the n-side interconnection part.

4. The device according to claim 1, wherein the metal film is covered with the resin layer.

5. A semiconductor light emitting device comprising:
   a semiconductor layer having a first surface and a second surface on an opposite side from the first surface, and including a light emitting layer;
   a p-side electrode provided on the semiconductor layer on the second surface side;
   an n-side electrode provided on the semiconductor layer on the second surface side;
   a support body provided on the second surface side and including a p-side interconnection part connected to the p-side electrode, an n-side interconnection part connected to the n-side electrode, and a resin layer provided between the p-side interconnection part and the n-side interconnection part;
   an optical layer provided on the first surface side, having a larger planar size than the semiconductor layer, and being transmissive to emission light of the light emitting layer;
   a first insulating film provided on a side surface of the semiconductor layer continued from the first surface; and a metal film including a first reflective part and a second reflective part, the first reflective part provided on the first insulating film which is interposed between the first reflective part and the side surface of the semiconductor layer, the second reflective part provided below the optical layer at a region around the side surface of the semiconductor layer, and extending toward a side surface of the device, wherein the resin layer includes:

a first resin layer provided around the p-side interconnection part and around the n-side interconnection part; and a second resin layer covering the metal film and being different from the first resin layer.

6. The device according to claim 5, wherein the first resin layer primarily includes epoxy resin, silicone resin, or fluororesin, and the second resin layer primarily includes polyimide resin.

7. The device according to claim 1, wherein the metal film includes an aluminum film.

8. The device according to claim 1, wherein the resin layer has a light blocking property for the emission light of the light emitting layer.

9. The device according to claim 1, further comprising:

a third insulating film provided between the first surface and the optical layer.

10. The device according to claim 1, wherein the optical layer includes a phosphor layer including a plurality of phosphors excited by the emission light of the light emitting layer and emitting light of a wavelength different from a wavelength of the emission light of the light emitting layer, and a binder integrating the plurality of phosphors and transmitting the emission light of the light emitting layer and emission light of the phosphors.

11. The device according to claim 1, wherein the optical layer includes a scattering layer including a plurality of scatterers scattering the emission light of the light emitting layer, and a binder integrating the plurality of scatterers and transmitting the emission light of the light emitting layer.

12. The device according to claim 1, wherein the semiconductor layer does not include a substrate on the first surface side, and the optical layer is provided on the first surface side without a substrate between the optical layer and the semiconductor layer.

13. The device according to claim 1, wherein the p-side interconnection part includes a p-side interconnection layer connected to the p-side electrode, and a p-side metal pillar connected to the p-side interconnection layer and being thicker than the p-side interconnection layer, and the n-side interconnection part includes an n-side interconnection layer connected to the n-side electrode, and an n-side metal pillar connected to the n-side interconnection layer and being thicker than the n-side interconnection layer.

14. The device according to claim 13, wherein each of the p-side metal pillar and the n-side metal pillar includes an external end part juxtaposed in a same surface.

15. The device according to claim 1, wherein a side surface of the optical layer is aligned with a side surface of the support body.

16. The device according to claim 1, wherein the first surface, the second surface, and the side surface of the semiconductor layer are covered with an inorganic insulating film.

17. The device according to claim 1, wherein the metal film includes copper, and a gold film is provided on an end surface of the second reflective part of the metal film.

18. The device according to claim 1, wherein the second reflective part of the metal film extends in a direction along the first surface of the semiconductor layer.

19. The device according to claim 5, wherein the second reflective part of the metal film extends in a direction along the first surface of the semiconductor layer.

* * * * *